US012672347B2

(12) United States Patent
Huang et al.

(10) Patent No.: US 12,672,347 B2
(45) Date of Patent: Jun. 30, 2026

(54) LOWER DEVICE ACCESS IN STACKED TRANSISTOR DEVICES

(71) Applicant: Intel Corporation, Santa Clara, CA (US)

(72) Inventors: Cheng-Ying Huang, Hillsboro, OR (US); Patrick Morrow, Portland, OR (US); Quan Shi, Portland, OR (US); Rohit Galatage, Hillsboro, OR (US); Nicole K. Thomas, Portland, OR (US); Munzarin F. Qayyum, Hillsboro, OR (US); Jami A. Wiedemer, Scappoose, OR (US); Gilbert Dewey, Beaverton, OR (US); Mauro J. Kobrinsky, Portland, OR (US); Marko Radosavljevic, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 81 days.

(21) Appl. No.: 17/847,628

(22) Filed: Jun. 23, 2022

(65) Prior Publication Data

US 2023/0420460 A1    Dec. 28, 2023

(51) Int. Cl.
| | |
|---|---|
| *H10D 84/85* | (2025.01) |
| *H10D 30/67* | (2025.01) |
| *H10D 62/10* | (2025.01) |
| *H10D 62/13* | (2025.01) |
| *H10W 20/20* | (2026.01) |

(52) U.S. Cl.
CPC ....... *H10D 84/853* (2025.01); *H10D 30/6735* (2025.01); *H10D 30/6757* (2025.01); *H10D 62/121* (2025.01); *H10D 62/151* (2025.01); *H10W 20/20* (2026.01)

(58) Field of Classification Search
CPC ...... H10B 10/12; H10D 30/014; H10D 30/43; H10D 30/6735; H10D 30/6757; H10D 62/121; H10D 64/017; H10D 84/85; H10D 30/019; H10D 30/501; H10D 62/151; H10D 84/0177; H10D 84/83135; H10D 84/853; H10D 64/258; H10D 64/254; H10D 84/83; H10D 84/0186; H10D 84/0149;

(Continued)

(56) References Cited

U.S. PATENT DOCUMENTS

| | | | |
|---|---|---|---|
| 2023/0137806 A1* | 5/2023 | Huang ................... | H10D 89/10 |
| | | | 257/369 |
| 2023/0187551 A1* | 6/2023 | Cheng ................ | H10D 30/6757 |
| | | | 257/369 |

* cited by examiner

*Primary Examiner* — Jonathan Han
(74) *Attorney, Agent, or Firm* — Arcane Law PLLC

(57) ABSTRACT

An integrated circuit structure includes a device layer including an upper device above a lower device. The upper device includes an upper source or drain region, and an upper source or drain contact coupled to the upper source or drain region. The lower device includes a lower source or drain region. A first conductive feature is below the device layer, where the first conductive feature is coupled to the lower source or drain region. A second conductive feature vertically extends through the device layer. In an example, the second conductive feature is to couple (i) the first conductive feature below the device layer and (ii) an interconnect structure above the device layer. Thus, the first and second conductive features facilitate a connection between the interconnect structure on the frontside of the integrated circuit and the lower source or drain region towards the backside of the integrated circuit.

22 Claims, 20 Drawing Sheets

(58) Field of Classification Search
      CPC ...... H10D 84/038; H10D 88/00; H10D 88/01;
                    B82Y 10/00; H01L 23/481; H10W 20/20
      See application file for complete search history.

Device 101:

Gate Electrode 127: ⬚

Gate Dielectric 120: ▬

Device 140

Gate Electrode 177: ⬚

Gate Dielectric 120: ▬

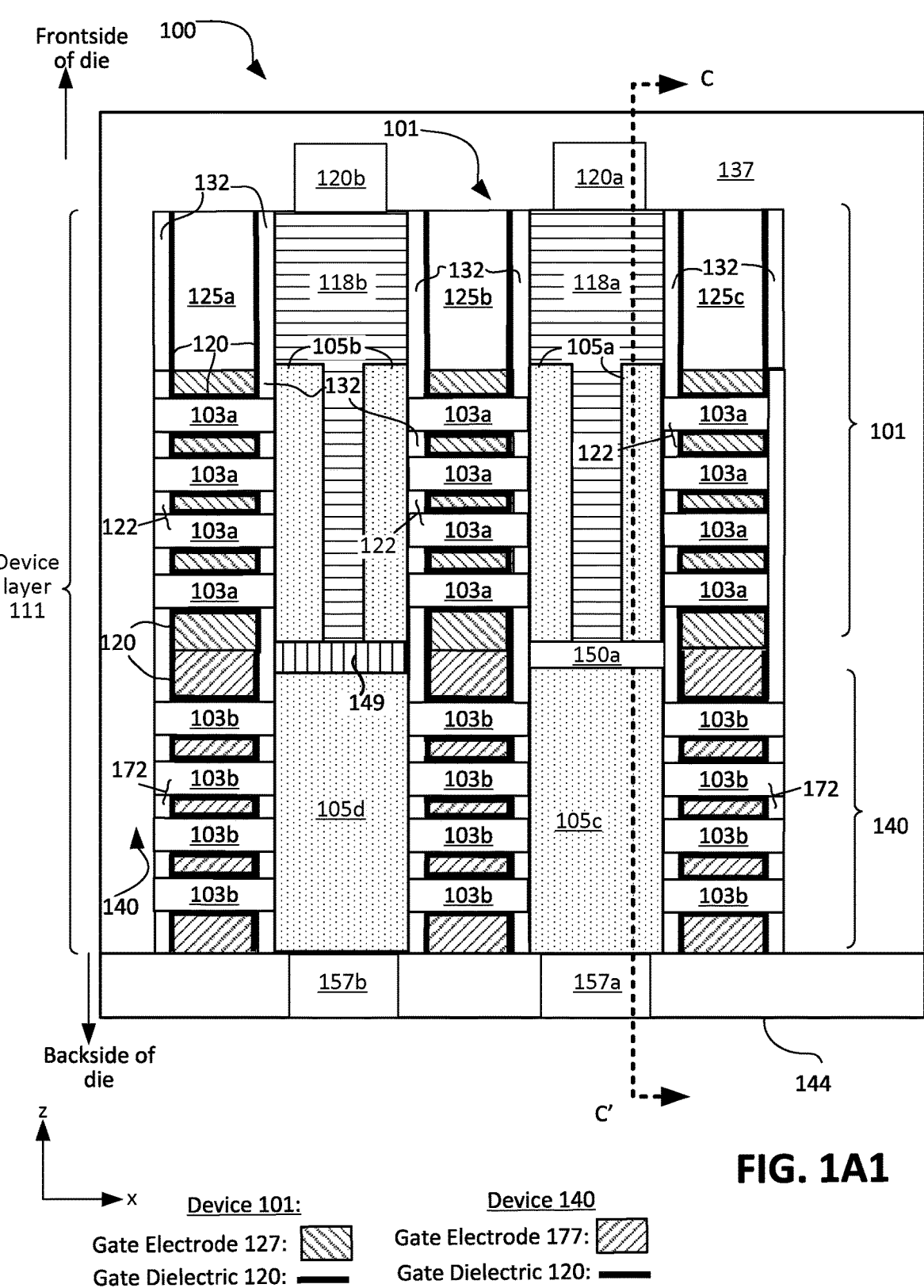
FIG. 1A1
Device 101:
Gate Electrode 127:
Gate Dielectric 120:
Device 140
Gate Electrode 177:
Gate Dielectric 120:

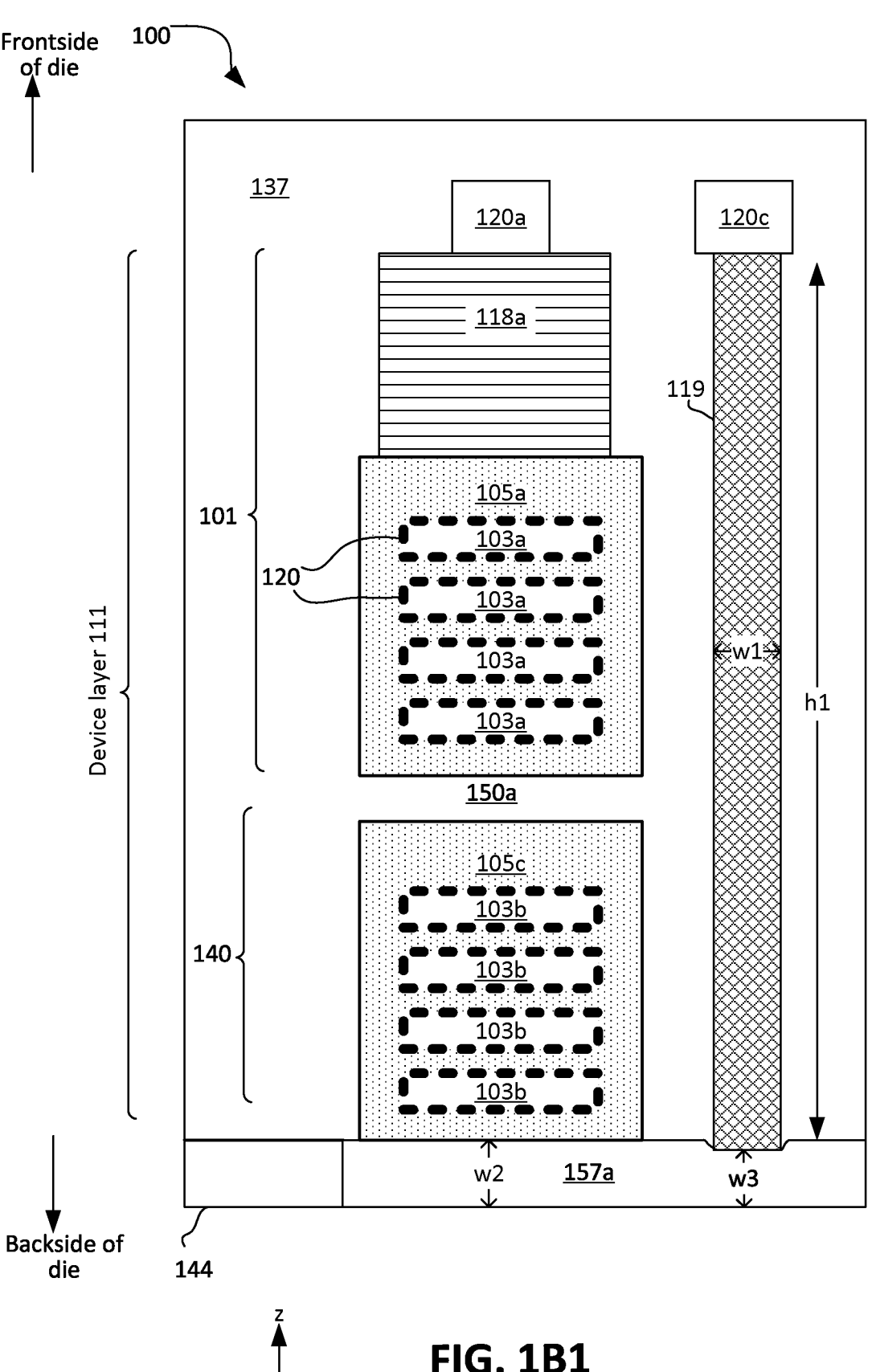
FIG. 1B1

Frontside of die

Backside of die

At least the interconnect features 157a, 157b, various source and drain contacts, substrate 144, two end gate structures, and some of the nanoribbons not illustrated in Fig. 1A Frontside
of die 100d Lowest (e.g.,
M0)
metallization
level Frontside of die 100e

137

120a

118a

101

120

105a

103a

103a

103a

103a

150a

140

105c

103b

103b

103b

103b

157a

170

171

120c

119

Backside of die z y

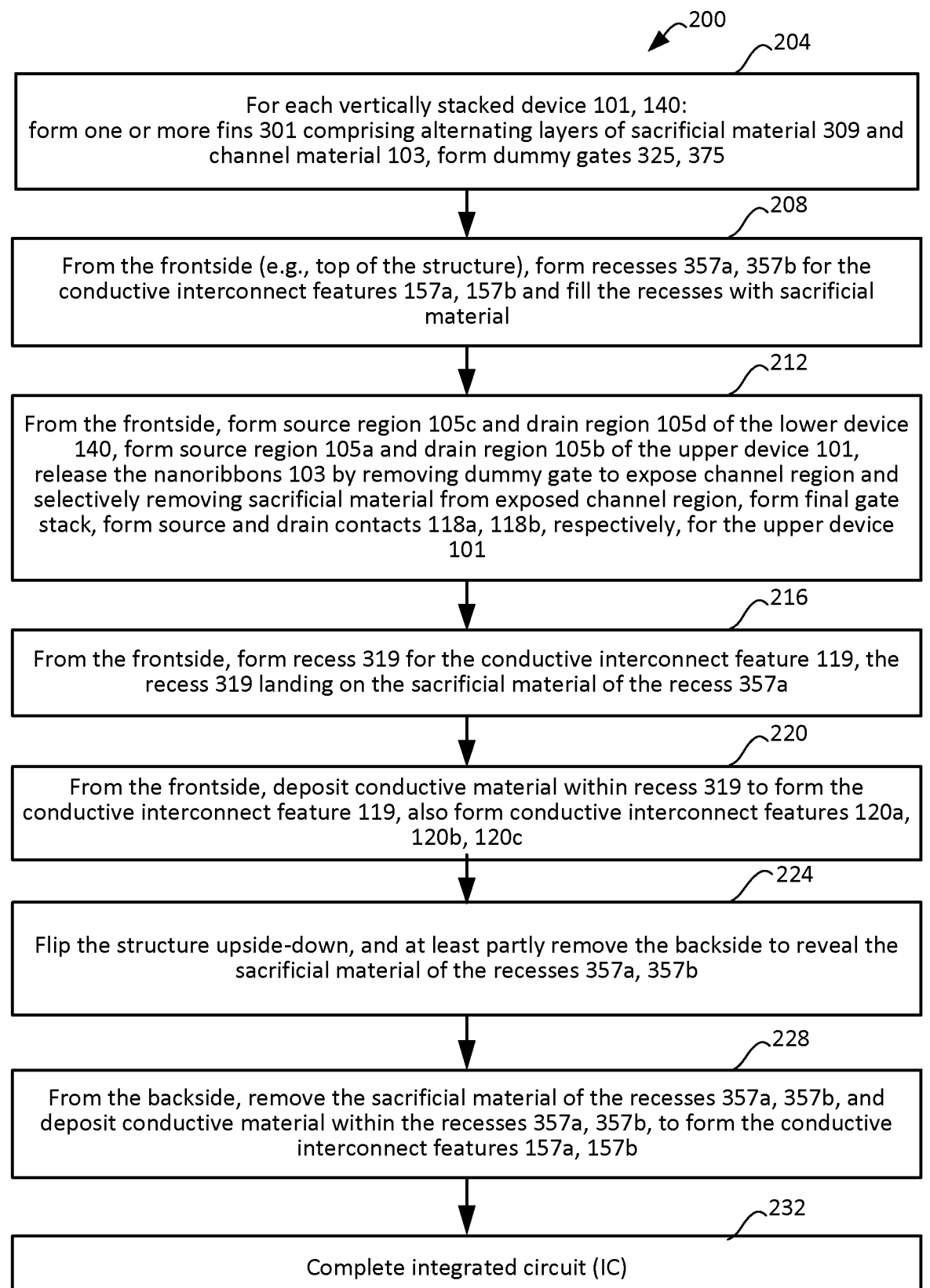

200

204

For each vertically stacked device 101, 140:
form one or more fins 301 comprising alternating layers of sacrificial material 309 and channel material 103, form dummy gates 325, 375

208

From the frontside (e.g., top of the structure), form recesses 357a, 357b for the conductive interconnect features 157a, 157b and fill the recesses with sacrificial material

212

From the frontside, form source region 105c and drain region 105d of the lower device 140, form source region 105a and drain region 105b of the upper device 101, release the nanoribbons 103 by removing dummy gate to expose channel region and selectively removing sacrificial material from exposed channel region, form final gate stack, form source and drain contacts 118a, 118b, respectively, for the upper device 101

216

From the frontside, form recess 319 for the conductive interconnect feature 119, the recess 319 landing on the sacrificial material of the recess 357a

220

From the frontside, deposit conductive material within recess 319 to form the conductive interconnect feature 119, also form conductive interconnect features 120a, 120b, 120c

224

Flip the structure upside-down, and at least partly remove the backside to reveal the sacrificial material of the recesses 357a, 357b

228

From the backside, remove the sacrificial material of the recesses 357a, 357b, and deposit conductive material within the recesses 357a, 357b, to form the conductive interconnect features 157a, 157b

232

Complete integrated circuit (IC)

FIG. 2

Device 101, and device 140:

Sacrificial
material 309

Device 101, and device 140:

Sacrificial
material 309

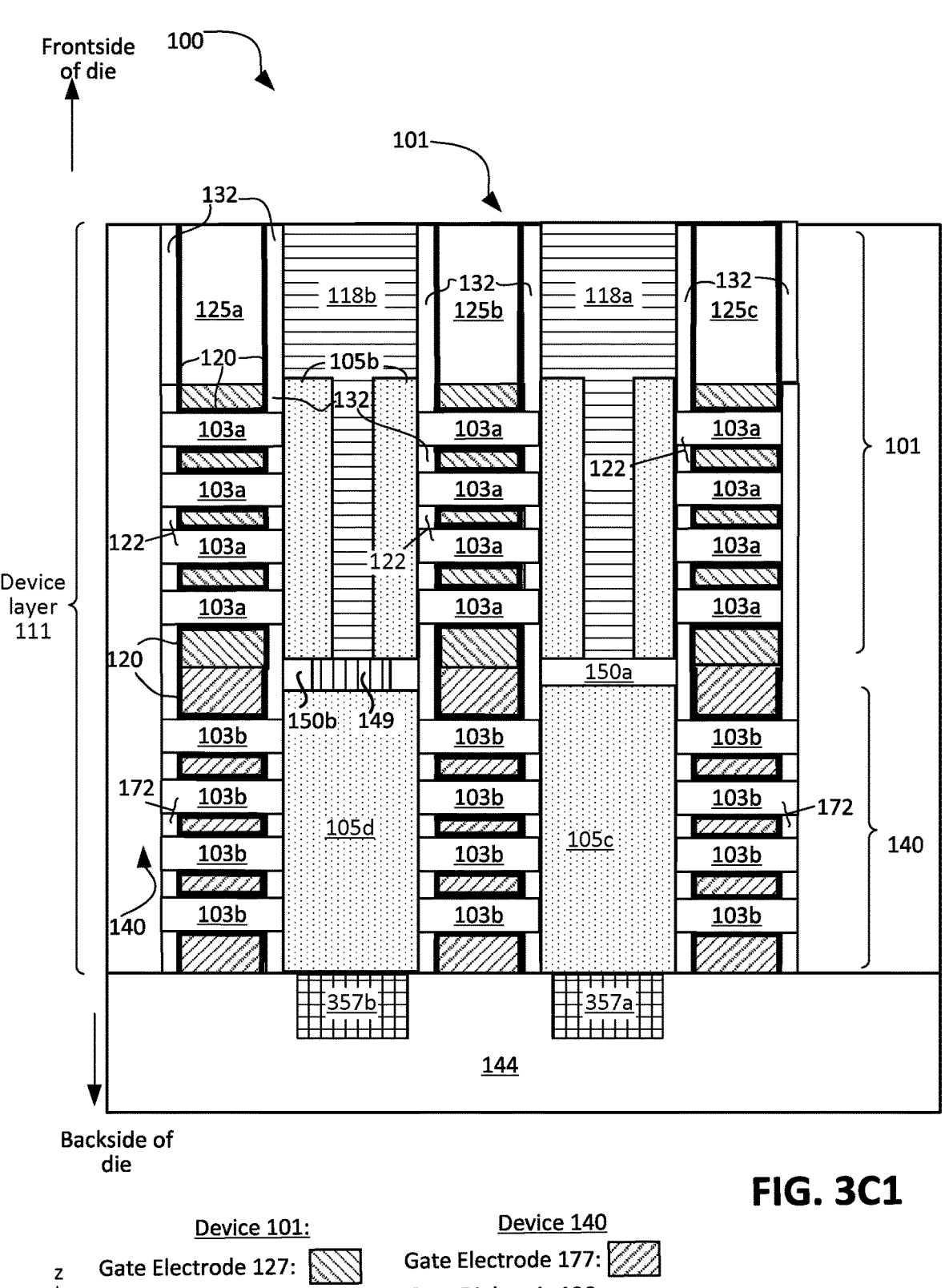
FIG. 3C1

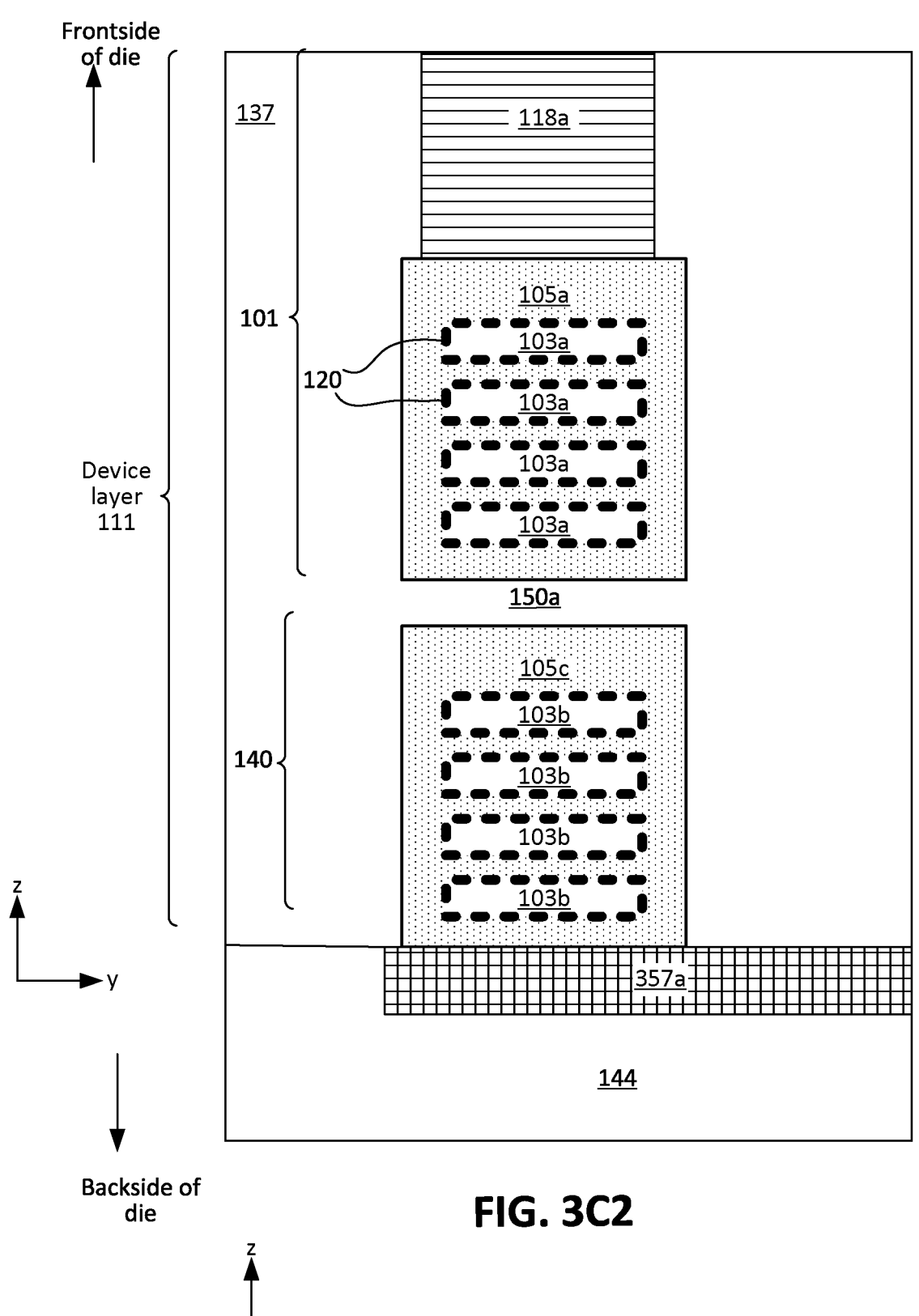
FIG. 3C2

Frontside
of die

Device layer 111

137

118a

101

105a 120    103a

103a

103a

103a

150a

140

105c

103b

103b

103b

103b

319

357a

144

Backside of
die

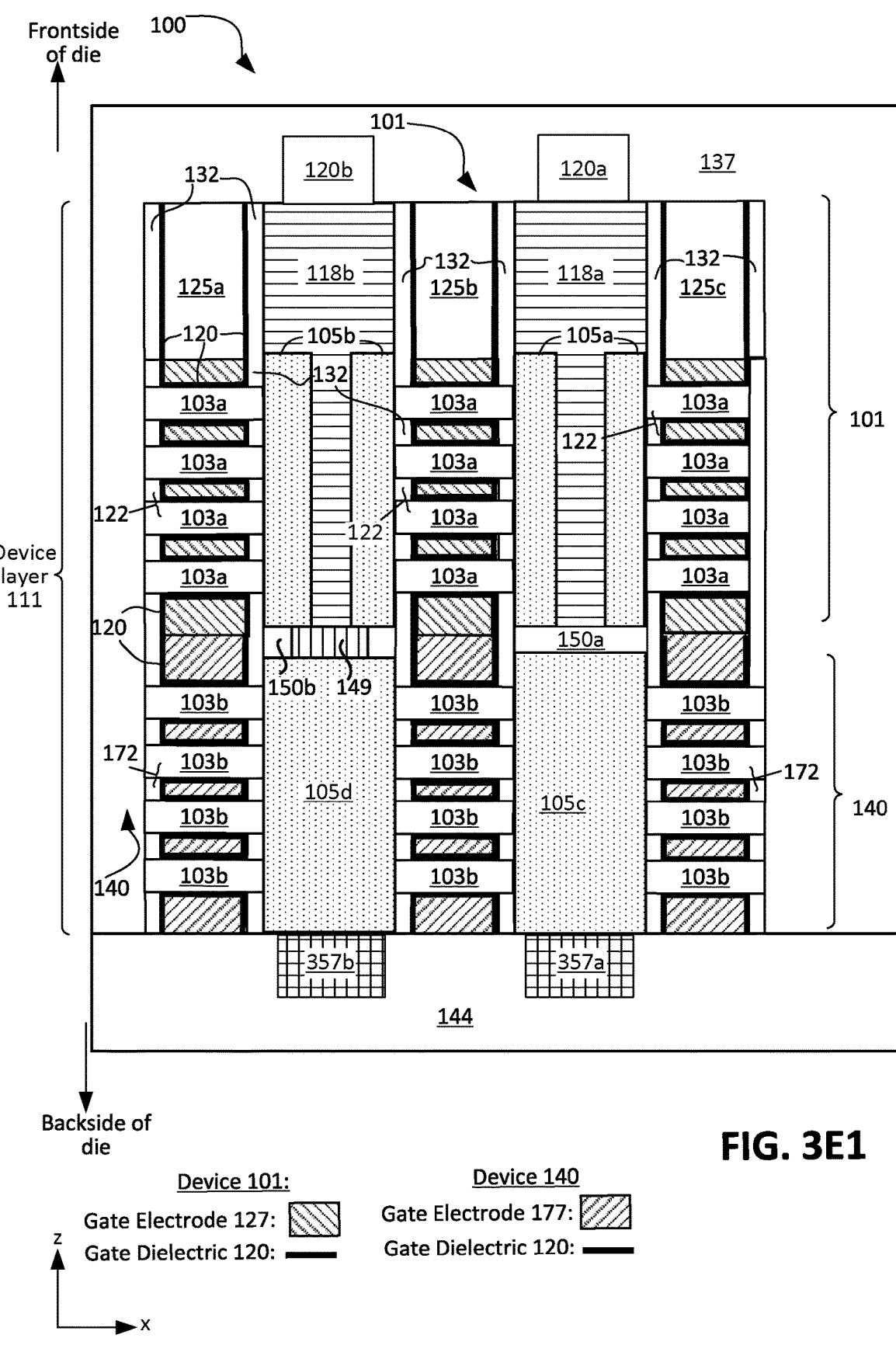
FIG. 3E1

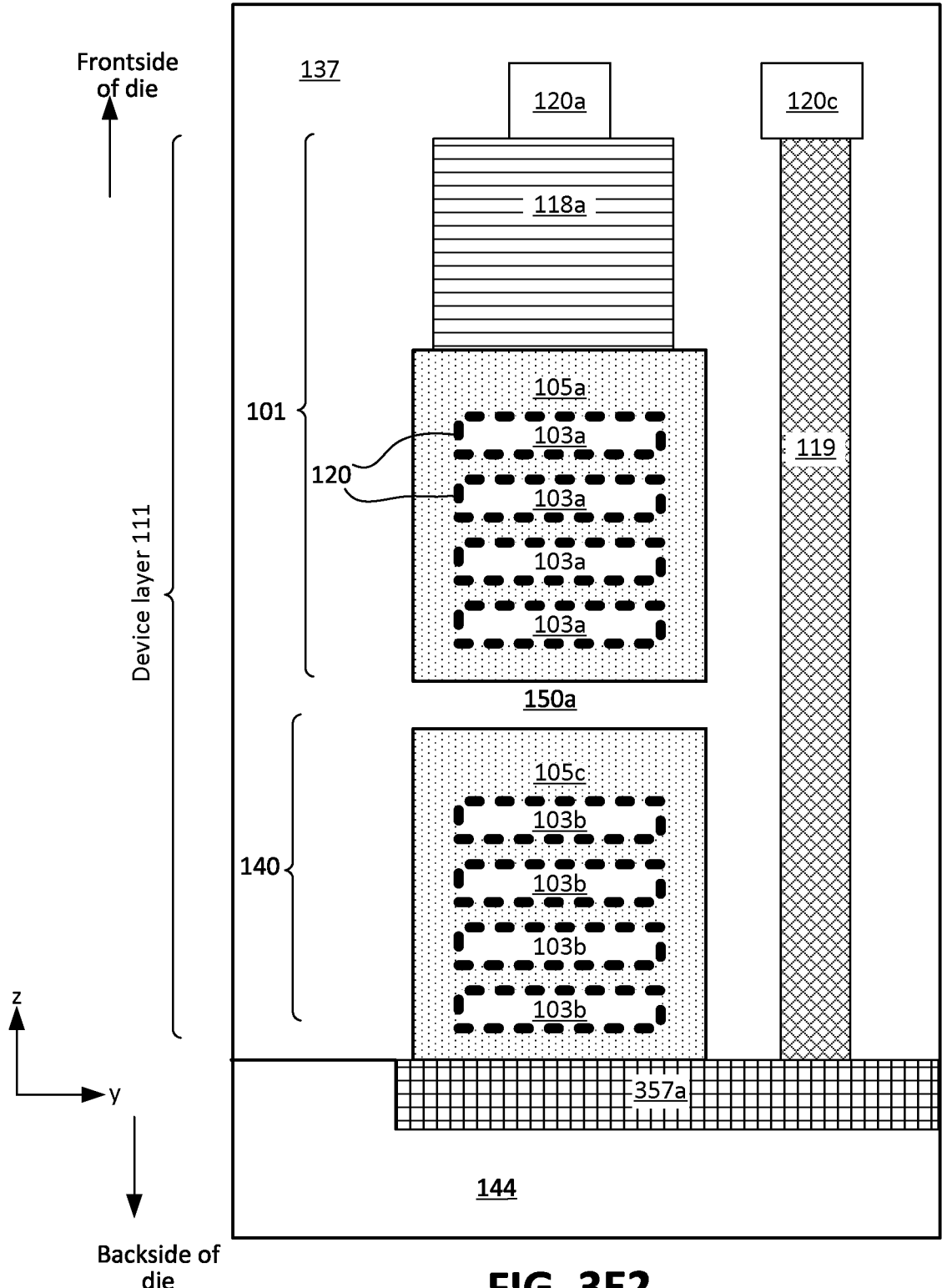
FIG. 3E2

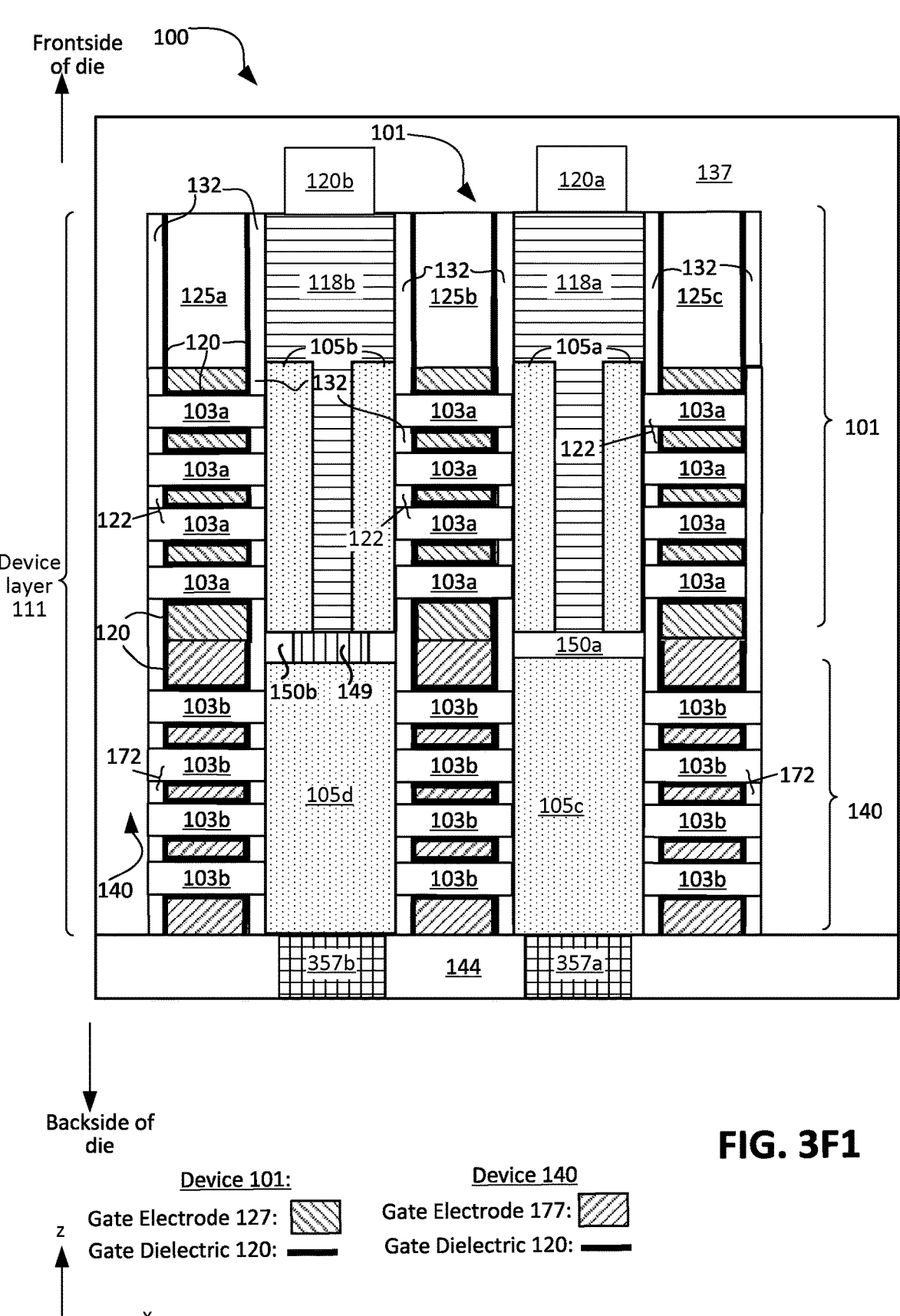
FIG. 3F1

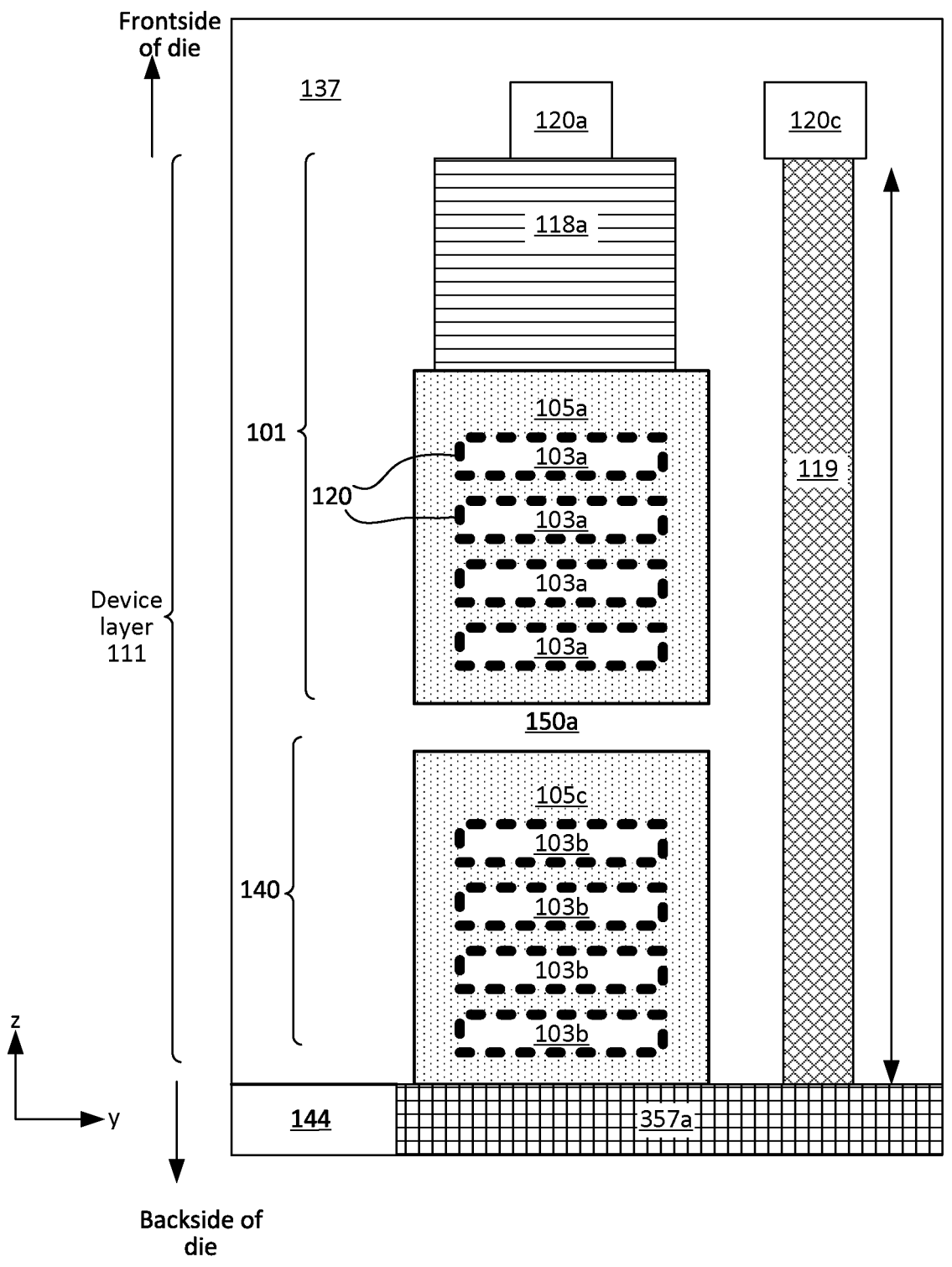
FIG. 3F2

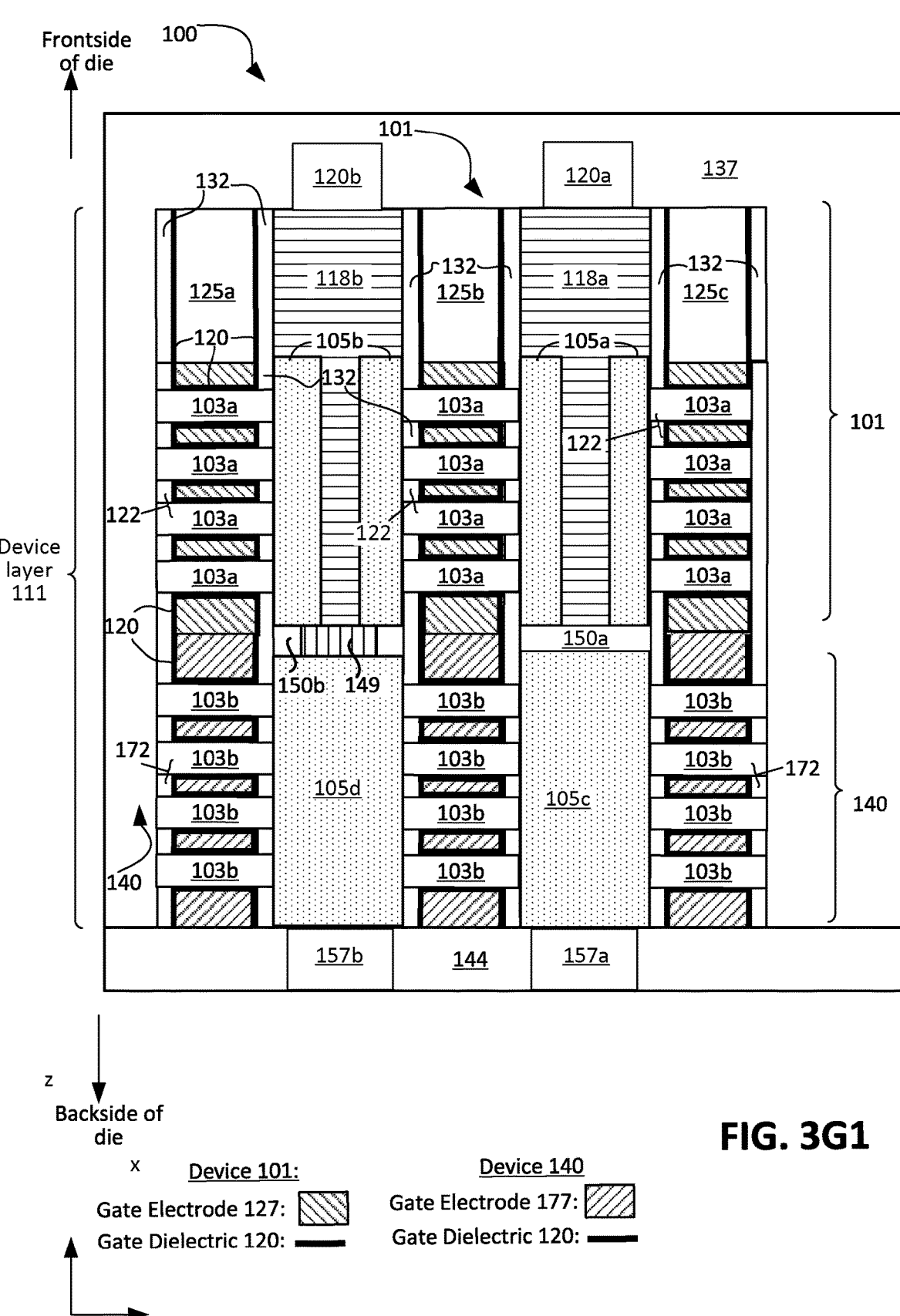
FIG. 3G1

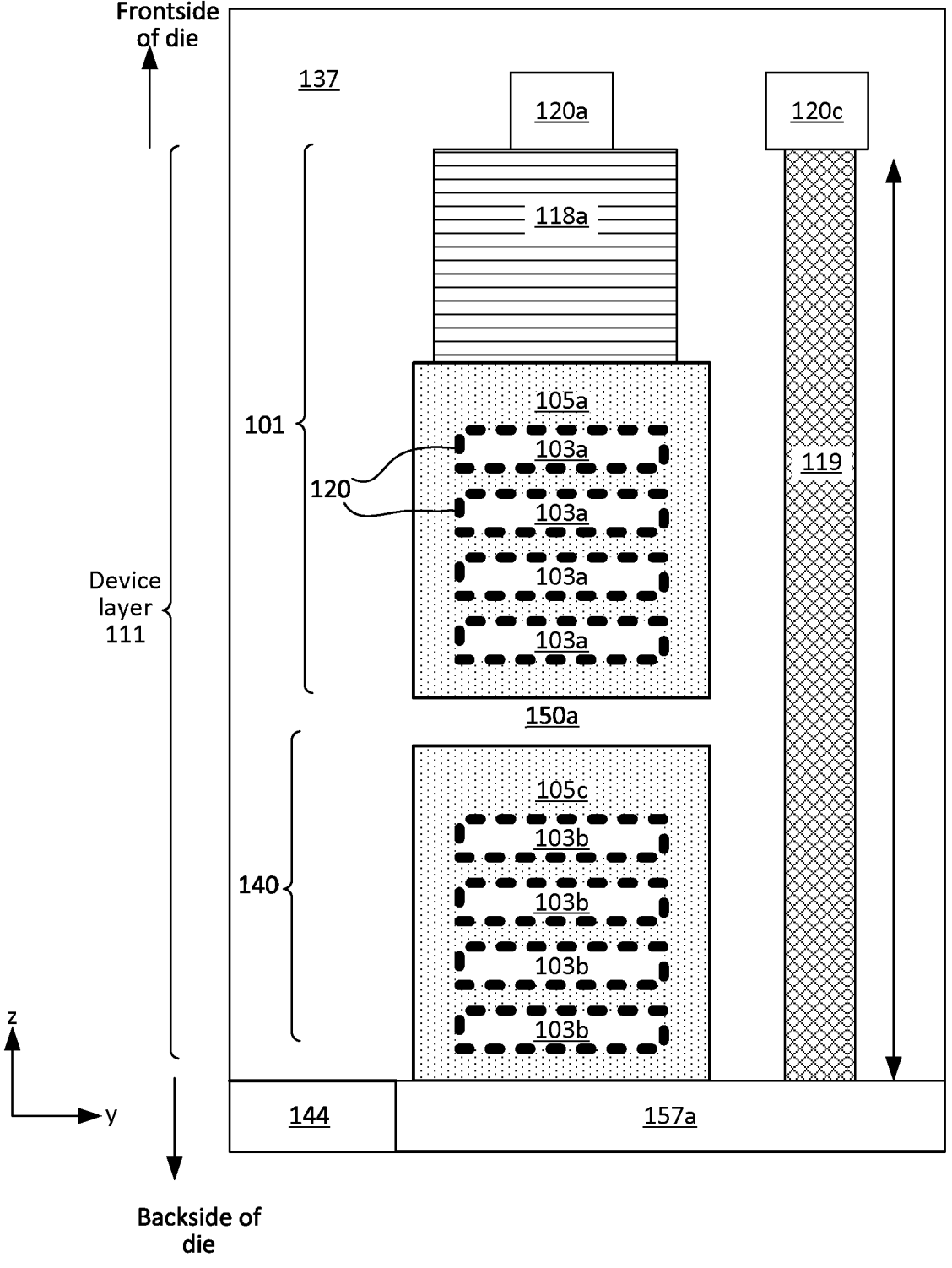
FIG. 3G2

LOWER DEVICE ACCESS IN STACKED TRANSISTOR DEVICES

FIELD OF THE DISCLOSURE

The present disclosure relates to integrated circuits, and more particularly, to stacked transistor devices.

BACKGROUND

Integrated circuitry continues to scale to smaller feature dimensions and higher transistor densities. A more recent development with respect to increasing transistor density is generally referred to as three-dimensional (3D) integration, which expands transistor density by exploiting the z-dimension (build upwards rather than laterally outwards in the x- and y-dimensions). For example, an upper transistor is stacked over a lower transistor. There are a number of non-trivial issues with respect to such stacked transistor configurations.

BRIEF DESCRIPTION OF THE DRAWINGS

FIG. 1A1 illustrates the integrated circuit structure of FIG. 1A, but with a different profile of a conductive layer between a drain region of the upper device and a drain region of the lower device, in accordance with an embodiment of the present disclosure.

FIG. 1B1 illustrates the integrated circuit structure of FIG. 1B, but with a different profile of a conductive interconnect feature, in accordance with an embodiment of the present disclosure.

FIG. 2 illustrates a flowchart depicting a method of forming the example semiconductor structure of FIGS. 1A and 1B, in accordance with an embodiment of the present disclosure.

FIGS. 3A, 3B, 3C1, 3C2, 3D, 3E1, 3E2, 3F1, 3F2, 3G1, and 3G2 collectively illustrate cross-sectional views of an example semiconductor structure (e.g., the semiconductor structure of FIGS. 1A and 1B) in various stages of processing, in accordance with an embodiment of the present disclosure.

Figure 1A:
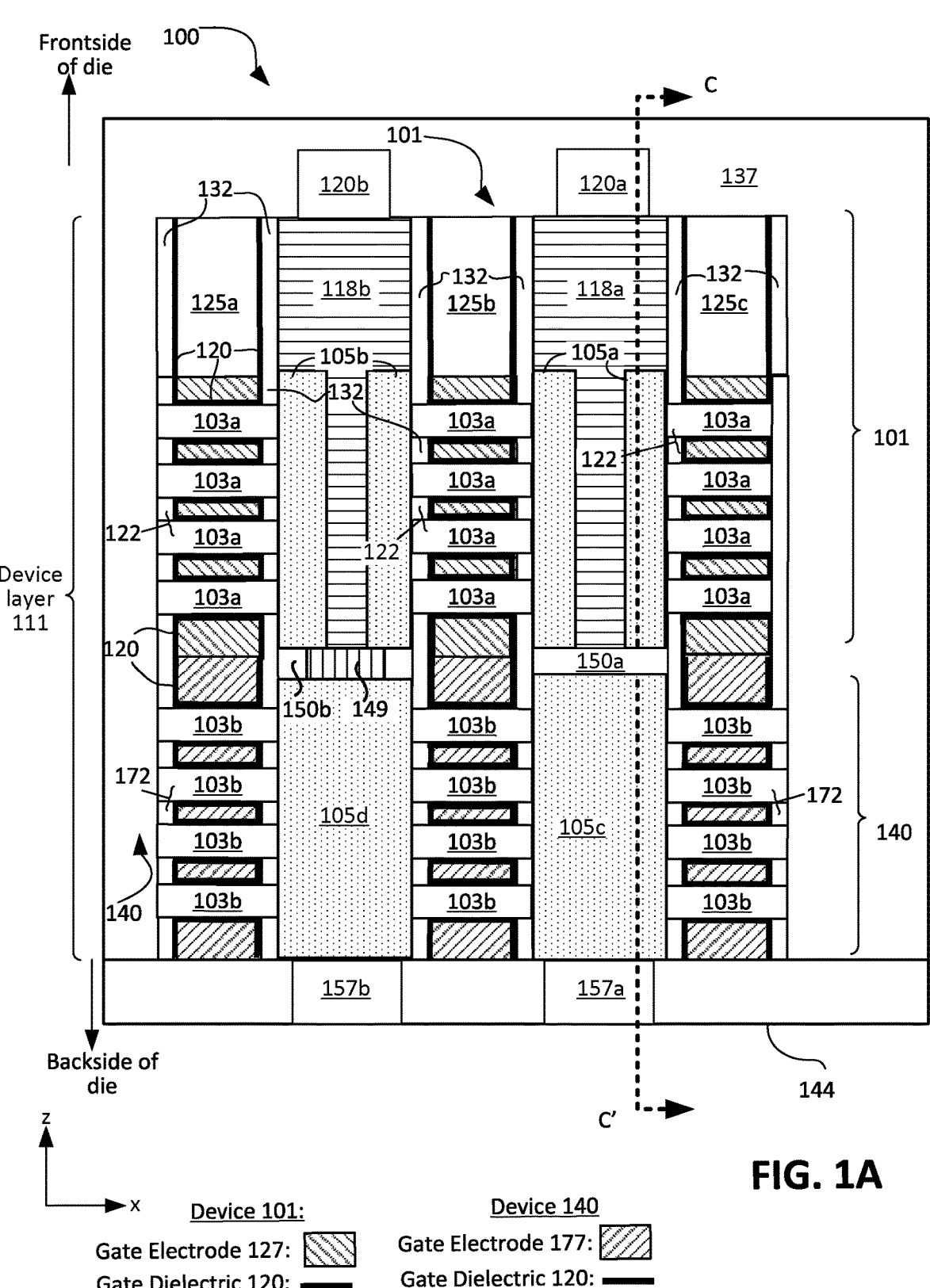
FIGS. 1A, 1B, and 1C illustrate various views of an integrated circuit structure including an upper device vertically stacked on a lower device, wherein the upper device comprises an upper source region and an upper drain region, wherein the lower device comprises a lower source region and a lower drain region, wherein the lower source region is accessed from a front side of the structure using a conductive interconnect feature (FIGS. 1B and 1C) that traverses along a height of the upper and lower devices, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

A vertically stacked transistor architecture is disclosed that includes an upper device and a lower device. The upper device includes an upper source or drain region, and the lower device includes a lower source or drain region. The upper source or drain region is coupled to an interconnect structure on the frontside of the integrated circuit, through a source or drain contact. The lower source or drain region has a lower source or drain contact that is below the lower device, on a backside of the integrated circuit. In an example, the lower source or drain contact comprises a conductive interconnect feature that extends laterally from under the lower source or drain region to under another conductive interconnect feature. The other conductive interconnect feature, such as a via, is a vertical conductive feature that extends through the device layer (e.g., where the device layer includes the upper and lower devices) and is coupled to the interconnect structure on the frontside of the integrated circuit. Thus, the lower source or drain contact and the conductive interconnect features facilitate a connection between the interconnect structure on the frontside of the integrated circuit and the lower source or drain region towards the backside of the integrated circuit.

In one embodiment, an integrated circuit structure comprises a device layer including an upper device stacked above a lower device. The upper device comprises (i) an upper source or drain region and (ii) an upper source or drain contact coupled to the upper source or drain region. The lower device comprises a lower source or drain region. In an example, a first conductive feature is below the device layer, where the first conductive feature is coupled to the lower source or drain region. In an example, a second conductive feature vertically extends through the device layer, where the second conductive feature is to couple (i) the first conductive feature below the device layer and (ii) an interconnect structure above the device layer. Thus, the first and second conductive features, in combination, facilitate a connection between the interconnect structure on the frontside of the integrated circuit and the lower source or drain region towards the backside of the integrated circuit.

In another embodiment, an integrated circuit structure comprises a lower device, and an upper device above the lower device. The lower device comprises a lower source or drain region. A lower source or drain contact is below, and coupled to, the lower source or drain region. In an example, a conductive via is to couple the lower source or drain contact to an interconnect structure above the upper device.

In yet another embodiment, an integrated circuit structure comprises a lower device, and an upper device above the lower device. The lower device comprises a lower source or drain region. An interconnect structure is above the upper device, e.g., on a frontside of the integrated circuit. A plurality of conductive features is to couple the lower source or drain region (e.g., on the backside of the integrated circuit) to the interconnect structure above the upper device (e.g., on the frontside of the integrated circuit). Numerous configurations and variations will be apparent in light of this disclosure.

GENERAL OVERVIEW

A stacked device architecture can include an upper device stacked above a lower device. In some cases, the upper and lower devices can be arranged in a complementary metal oxide semiconductor (CMOS) architecture. For instance, the upper device can be one of an n-channel metal-oxide semiconductor (NMOS) device or a p-channel metal-oxide semiconductor (PMOS) device, and the lower device can be the other of the NMOS or the PMOS device. In an example, an upper source or drain contact of an upper source or drain region of the upper device is above the upper and lower devices, can be coupled to an interconnect structure on a frontside of the integrated circuit. However, a lower source or drain region is to be contacted from the backside of the integrated circuit. Accordingly, techniques are provided herein to couple a lower source or drain region of the lower device to the interconnect structure on the frontside of the integrated circuit, using a plurality of conductive interconnect features, which includes at least a substantially horizontal conductive interconnect feature and a substantially vertical conductive interconnect feature.

For example, the upper device comprises a first upper source or drain region, and a corresponding first upper source or drain contact that is coupled to the first upper source or drain region. In an example, the first upper source or drain contact extends within the first upper source or drain region. The upper device also comprises a second upper source or drain region, and a corresponding second upper source or drain contact that is coupled to the second upper source or drain region. In an example, the second upper source or drain contact extends within the second upper source or drain region. Also, the lower device comprises (i) a first lower source or drain region that is below the first upper source or drain region, and (ii) a second lower source or drain region that is below the second upper source or drain region. In an example, the first lower source or drain region and the first upper source or drain region are separated by a first dielectric isolation region, and similarly the second lower source or drain region and the second upper source or drain region are separated by a second dielectric isolation region.

In an example, the first (or second) lower source or drain region and the first (or second) upper source or drain region are electrically coupled by a conductive layer extending within the first isolation region. For example, the first upper source or drain contact extends though the first upper source or drain region, and makes contact with (e.g., lands on) a top surface of the conductive layer, where a bottom surface of the conductive layer is in contact with the first lower source or drain region. In some such cases, the first upper source or drain contact and the conductive layer are a continuous and monolithic body of conductive material. In any such cases, both the first upper source or drain region and the first lower source or drain region can be accessed through the first upper source or drain contact. Note that although the first lower source or drain region can have a corresponding contact on the backside, such a contact may act as a dummy contact, as the first lower source or drain region is being accessed from the frontside using the first upper source or drain contact. In another example, the first upper source or drain region and the first lower source or drain region may be isolated from each other, in which case these source or drain regions can be accessed in another manner, such as described below.

In another example, the second upper source or drain region and the second lower source or drain region may be separated by a corresponding isolation region. In an example, the second upper source or drain contact may extend within the second upper source or drain region, and may contact (e.g., land on) the isolation region. The second lower source or drain region has a second lower source or drain contact, where the second lower source or drain contact is a backside contact or conductive interconnect feature that may not extend within the second lower source or drain region, in an example. The backside contact or conductive interconnect feature of the second lower source or drain contact is also referred to herein as a horizontal conductive interconnect feature, as this backside contact or conductive interconnect feature extends substantially horizontally from under the second lower source or drain region to under a vertical conductive interconnect feature. A device layer includes the upper and lower devices, and the vertical conductive interconnect feature extends substantially vertically through the device layer. In an example, the vertical conductive interconnect feature is coupled to the horizontal conductive backside contact or interconnect feature, such as the example case where the vertical conductive interconnect feature lands on the horizontal conductive backside contact or interconnect feature. A top end of the vertical conductive interconnect feature is coupled to the frontside interconnect structure (e.g., to which the upper source or drain regions of the upper device are also coupled). Thus, the vertical conductive interconnect feature extends from the backside of the integrated circuit to the frontside of the integrated circuit. Thus, the vertical conductive interconnect feature facilitates connection of the second lower source or drain region to the interconnect structure on the frontside of the integrated circuit.

In an example, the vertical conductive interconnect feature is a conductive via. In an example, each of the horizontal and vertical conductive interconnect features comprise one or more layers, such as one or more liner or barrier layers, and conductive fill material within the liner or barrier layers. In an example, the liner or barrier layer prevents or reduces diffusion of the conductive fill material into adjacent dielectric material.

In an example, the above discussed horizontal conductive backside contact or interconnect feature may be directly coupled to the vertical conductive interconnect feature, without any intervening interconnect features is between. In another example, the horizontal conductive backside contact or interconnect feature may be coupled to the vertical conductive interconnect feature through a backside interconnect structure. For example, the backside interconnect structure comprises a plurality of interconnect features, such as conductive lines and vias, below the lower device, and electrically couples the horizontal conductive backside contact or interconnect feature to the vertical conductive interconnect feature.

In an example, a top portion of the vertical conductive interconnect feature may be coupled to one or more intervening conductive interconnect features, which may be coupled to the metallization levels of the frontside interconnect structure. In this example, the top portion of the vertical conductive interconnect feature is below a bottom surface of a lowest metallization level in the frontside. In another example, a top portion of the vertical conductive interconnect feature may be directly coupled (e.g., in contact with) to the lowest metallization level in the frontside.

In an example, each of the upper and lower devices is a gate-all-around (GAA) device, in which a gate structure wraps around a channel region that extends laterally between a corresponding source region and a drain region. An example of the channel regions in a GAA device includes nanoribbons. As will be appreciated in light of this disclosure, reference to nanoribbons as channel regions is also intended to include other gate-all-around channel regions, such as nanowires, nanosheets, and other such semiconductor bodies around which a gate structure can wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets or some other body around which a gate structure can at least partially wrap (such as the semiconductor bodies of a forksheet device or a fin-based device).

To form the stacked device architecture including the vertical and horizontal interconnect features, initially the upper and lower devices are formed. In an example, prior to forming the source and drain regions of the upper and lower devices, a horizontal recess is formed in the substrate, where the horizontal recess is below a space in which the second lower source or drain is to be eventually formed. The horizontal recess is formed from the top or frontside, e.g., through an opening in which the second upper and second lower source or drain regions are to be eventually formed. The horizontal recess is then filled with sacrificial material from the frontside. Subsequently, the upper and lower devices, including the various source and drain regions, the first and second upper source or drain contacts, and the gate stack of the upper and lower devices, are formed. In an example, the thus formed devices are encapsulated within one or more layers of interlayer dielectric material (ILD).

Subsequently, a vertical recess is formed (e.g., from the top or frontside of the integrated circuit) within the ILD. The vertical recess may be formed at an appropriate time during the process flow. For example, when the vertical conductive interconnect feature contacts the lowest metallization level of the frontside interconnect structure, the vertical recess is formed prior to forming the lowest metallization level of that frontside interconnect structure, such as during the formation of frontside contacts and/or local interconnect features. In another example when the vertical conductive interconnect feature contacts another intervening interconnect feature (which in turn is coupled to the frontside interconnect structure), the vertical recess is formed prior to forming this intervening interconnect feature. In an example, the vertical recess lands on the sacrificial material within the horizontal recess. The vertical recess is then filled with conductive material, to form the vertical conductive interconnect feature. Subsequently, the frontside interconnect structure is formed.

The structure is then flipped upside-down, such that the backside of the integrated circuit is now on top. The backside is grinded or at least in part removed, until the previously discussed horizontal recess (which was previously filled with sacrificial material) is exposed through the backside. From the backside, the sacrificial material of the horizontal recess is replaced with conductive material, to form the horizontal conductive interconnect feature. As previously discussed above, the vertical recess landed on the sacrificial material within the horizontal recess, and hence, after formation of the horizontal conductive interconnect feature, the vertical and horizontal conductive interconnect features are now in contact with each other.

In an example where the vertical and horizontal conductive interconnect features are coupled through a backside interconnect structure, the horizontal conductive interconnect feature is formed as discussed above. Subsequently, from the backside, the backside interconnect structure is formed, which couples the vertical and horizontal conductive interconnect features.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools be used to detect an upper device above a lower device, wherein a lower source or drain region of the lower device is coupled to a frontside interconnect structure above the upper and lower devices, through a plurality of conductive interconnect features. In an example, the plurality of conductive interconnect features comprises a horizontal conductive interconnect feature that laterally extends from under the lower source or drain region of the lower device to under a vertical conductive interconnect feature (e.g., which is a conductive via), and the vertical conductive interconnect feature traverses along a height of the upper and lower devices, to be coupled to the frontside interconnect structure. Numerous configurations and variations will be apparent in light of this disclosure.

Architecture

Figure 1B:
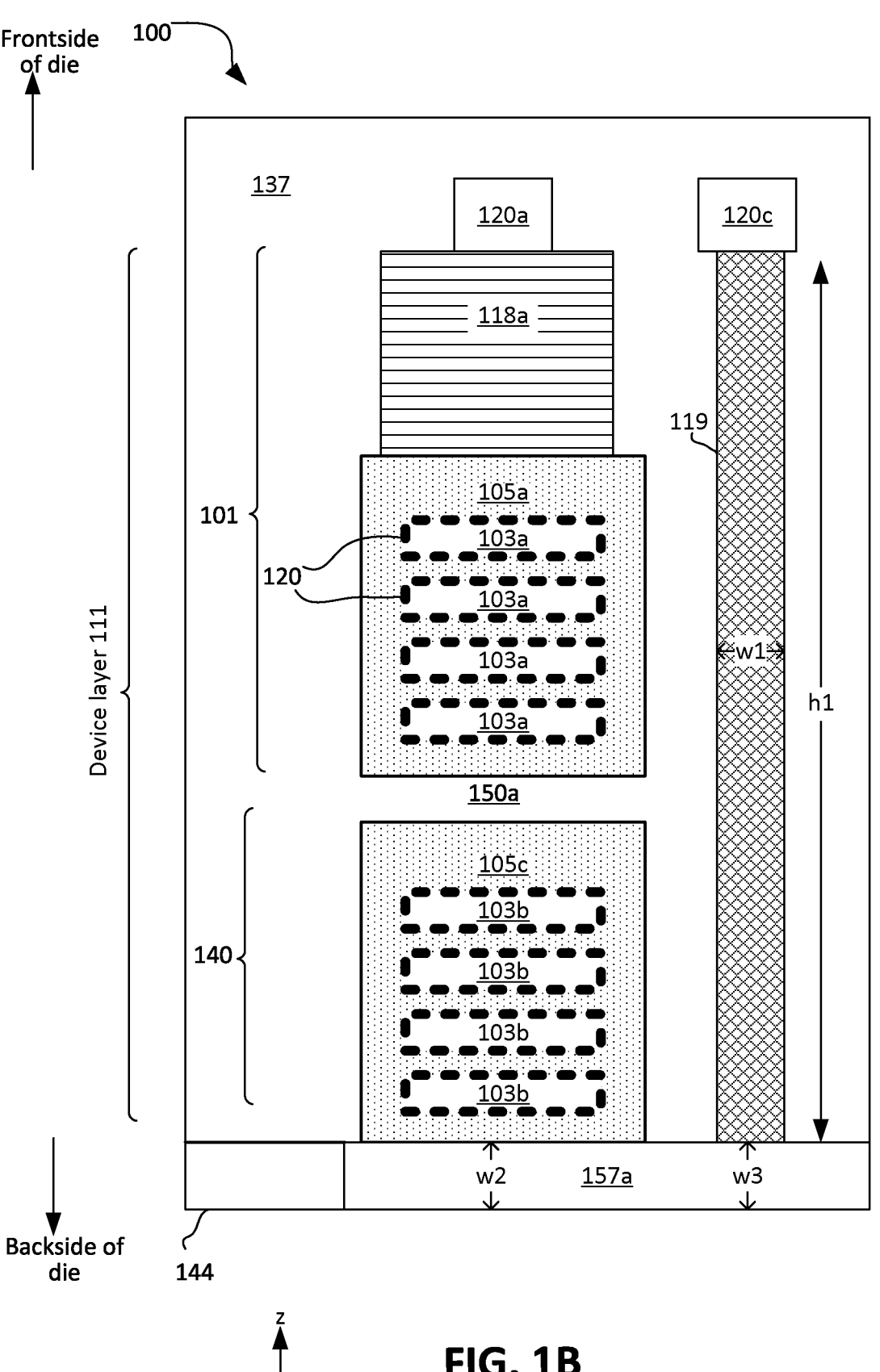
Figure 1C:
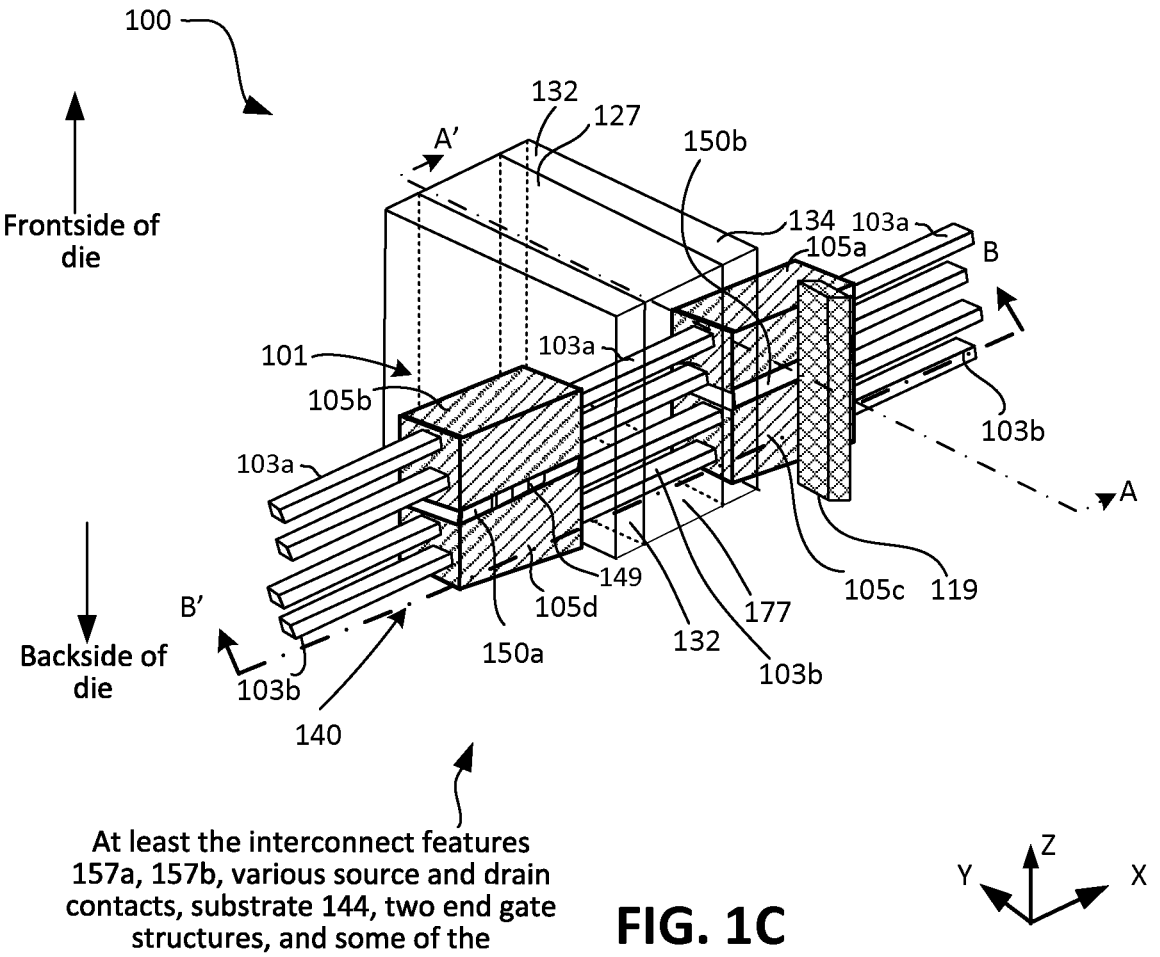

FIGS. 1A and 1B illustrate cross-sectional views and FIG. 1C illustrate a perspective view of an integrated circuit structure 100 (also referred to herein as "structure 100") including an upper device 101 vertically stacked on a lower device 140, wherein the upper device 101 comprises an upper source region 105a and an upper drain region 105b, wherein the lower device 140 comprises a lower source region 105c and a lower drain region 105d, wherein the lower source region 105c is accessed from a front side of the structure 100 using a conductive interconnect feature 119 (see FIGS. 1B and 1C) that traverses along a height of the upper and lower devices 101, 140, in accordance with an embodiment of the present disclosure.

As can be seen, the cross-section of FIG. 1A is taken parallel to, and through, the fin structure, e.g., along a dotted line B-B' of FIG. 1C, such that the channel, source, and drain regions are shown. The cross-section of FIG. 1B is taken perpendicular to the fin structure, e.g., along a dotted line A-A' of FIG. 1C and along a dotted line C-C' of FIG. 1A, such that the upper and lower source regions 105a, 105c and the conductive interconnect feature 119 are visible. Note that the channel regions (e.g., nanoribbons 103a, 103b) of the upper and lower devices 101, 140 would not be visible in the cross-sectional view of FIG. 1B, as the nanoribbons 103 would be covered by the source regions 105a, 105c—hence, cross sections of the nanoribbons 103a, 103b and dielectric material 120 wrapped around the nanoribbons 103 are illustrated in FIG. 1B using dotted lines.

Note that the perspective view of FIG. 1C does not illustrate many components of the structure 100 which are illustrated in FIGS. 1A and 1B. For example, FIG. 1C at least does not illustrate conductive interconnect features 157a, 157b, various source and drain contacts, substrate 144, two end gate structures, and some of the nanoribbons 103, which are discussed herein in turn and are illustrated in FIGS. 1A and 1B. FIG. 1C is primarily to illustrate an example location of the conductive interconnect feature 119 with respect to the upper and lower source regions 105a and 105c.

The cross-sectional view of FIG. 1A includes three channel regions along with a source region and a drain region for each device 101, 140, but any number of channel regions and corresponding source and drain regions can be included, as will be appreciated. Further note that all devices shown in this example are contacted, but other examples may include dummy devices or devices that are not connected into the overall circuit. The semiconductor bodies 103a and 103b included in the channel regions of the devices 101 and 140, respectively, can vary in form, but in this example embodiment are in the form of nanoribbons. In particular, the channel regions of the upper device 101 in this example case include a first set of four nanoribbons 103a, and the channel regions of the lower device 140 include a second set of four nanoribbons 103b (although note that for purposes of illustrative clarity, the perspective view of FIG. 1C illustrate only two nanoribbons per set and for each upper and lower devices). Other examples may include fewer nanoribbons per channel region (e.g., one or two or three), or more nanoribbons per channel region (e.g., five or six). Still other embodiments may include other channel configurations, such as one or more nanowires or nanosheets, or a fin, or other semiconductor body, including both planar and non-planar topologies. To this end, the present disclosure is not intended to be limited to any particular channel configuration or topology; rather the techniques provided herein can be used in any transistor architecture that uses vertically stacked transistors.

In an example, the stacked upper device 101 and the lower device 140 is within a device layer 111. The device layer 111 may comprise, in an example, many such stacked upper and lower devices (and may also possibly include one or more non-stacked devices as well). The frontside of the die is above the device layer 111, and the backside of the die is below the device layer 111, as labelled in FIGS. 1A and 1B.

As illustrated in FIG. 1A, the upper device 101 includes a source region 105a and a drain region 105b, each adjacent to a gated channel region on either side. As illustrated in FIG. 1A, for each of the upper and lower devices, three sets of nanoribbons and corresponding three sets of upper gate stacks and three sets of lower gate stacks are illustrated. Note that in FIG. 1C, for purposes of illustrative clarity, only one set of upper and lower gate stack is illustrated (e.g., the middle gate stack of each device is illustrated in FIG. 1C).

As illustrated, the upper device 101 includes the source region 105a and the drain region 105b, each adjacent to a gated channel region on either side. Similarly, the lower device 101 includes the source region 105c and the drain region 105d. Other embodiments may not have gated channel regions to each side of individual source or drain regions, such as the example case where only the channel region between source region 105a and drain region 105b (or only the channel region between source region 105c and drain region 105d) is present.

Note that in an example, the location of the source and drain regions in one or both devices may be interchanged. Thus, the regions 105a and 105c may be the drain regions of the upper and lower devices, respectively, and/or the regions 105b and 105d may be the source regions of the upper and lower devices, respectively.

Although not illustrated in FIGS. 1A-1C, in an example, the source region 105a of the upper device 101 may include a nucleation region adjacent to the nanoribbons 103, and an epitaxially formed main source region adjacent to the nucleation region, where a doping concentration of the main source region may be higher than that of the nucleation region. Each of the other source and drain regions 105b, 105c, 105d may also similarly have a corresponding nucleation region and a main region. In some examples, the nucleation regions may be absent. Numerous source and drain configurations can be used, and the present disclosure is not intended to be limited to any particular ones.

In some example embodiments, the source and drain regions 105a, 105b, 105c, 105d are epitaxial source and drain regions that are provided after the relevant portion of the fin or fin structure was isolated and etched away or otherwise removed. In other embodiments, the source/drain regions may be doped portions of the fin structure or substrate, rather than epi regions. In some embodiments using an etch and replace process, the epi source and drain regions are faceted and overgrown from a trench within insulator material (e.g., shallow trench isolation, or gate spacer 132 that deposits on the sides of the fin structure in the source and drain locations), and the corresponding source or drain contact structure lands on that faceted portion. Alternatively, in other embodiments, the faceted portion of epi source and drain regions can be removed (e.g., via chemical mechanical planarization, or CMP), and the corresponding source or drain contact structure lands on that planarized portion.

The source and drain regions can be any suitable semiconductor material and may include any dopant scheme. In an example, source and drain regions can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. Example n-type dopants include phosphorus, bismuth, antimony, arsenic, lithium, and tellurium. In one specific embodiment, PMOS source and drain regions are boron-doped SiGe, and NMOS source and drain regions are phosphorus-doped silicon. In a more general sense, the source and drain regions can be any semiconductor material suitable for a given application.

In some cases, the epi source and drain regions may include a multilayer structure, such as a germanium cap on a SiGe body, or a germanium body and a carbon-containing SiGe spacer or liner between the corresponding channel region and that germanium body. In any such cases, a portion of the epi source and drain regions may have a component that is graded in concentration, such as a graded germanium concentration to facilitate lattice matching, or a graded dopant concentration to facilitate low contact resistance. Any number of source and drain configurations can be used as will be appreciated, and the present disclosure is not intended to be limited to any particular such configurations.

In an example, the source region 105a is separated from the source region 105c by an isolation region 150a, the drain region 105b is separated from the drain region 105d by another isolation region 150b. The isolation regions 150a, 150b comprise one or more layers of liner material and/or dielectric fill material, such as one or more layers of oxides, nitrides, carbides, oxynitrides, oxycarbides, and oxycarbonitrides, or a combination of one or more of these materials. For example, one or both of the isolation regions 150a, 150b can be multi-layer comprising a nitride liner and an oxide dielectric material.

As illustrated in FIG. 1A, for the upper device 101, a source contact 118a extends within the source region 105a, and a drain contact 118b extends within the drain region 105b. In an example, the source contact 118a fully extends within, and extends through, the source region 105a, such that the source contact 118a is in contact with the isolation region 150a. For example, a bottom surface of the source contact 118a is coplanar with a bottom surface of the source region 105a. In an example, the drain contact 118b fully extends within, and extends through, the drain region 105b, such that a bottom surface of the drain contact 118b is coplanar with a bottom surface of the drain region 105b. Note that while FIG. 1A illustrates the source and drain contacts, these contacts are not illustrated in FIG. 1C.

For the lower device 140, a conductive interconnect feature 157a acts a source contact for the source region 105c, and a conductive interconnect feature 157b acts a drain contact for the drain region 105d. In an example, the conductive interconnect feature 157a is coupled to the source region 105c of the lower device 140, and the conductive interconnect feature 157b is coupled to the drain region 105d of the lower device 140. Note that "coupled to" as used above does not require a direct contact; rather, such coupling may be accomplished through, in this example, one or more intervening layers, such as one or more layers of silicide, germanide, and/or germanosilicide. In an example, such layers of silicide, germanide, and/or germanosilicide may be considered part of the corresponding source or drain regions, whereas in another example such layers are may be considered to be external to the corresponding source or drain regions.

Thus, while the source contact 118a and the drain contact 118b of the upper device 101 extend within the source region 105a and the drain region 105b, respectively, in the example of FIG. 1A, the conductive interconnect features 157a, 157b acting respectively as source and drain contacts of the lower device 140 may not extend within the source region 105c and drain region 105d, respectively. However, in another example, the conductive interconnect feature 157a (or another source contact between the conductive interconnect feature 157a and the source region 105c) may extend within the source region 105c (e.g., at least in part similar to the source contact 118b). Similarly, in another example, the conductive interconnect feature 157b (or another drain contact between the conductive interconnect feature 157b and the drain region 105d) may extend within the drain region 105d (e.g., at least in part similar to the drain contact 118b).

As illustrated, the source contact 118a of the upper device 101 is above and at least in part aligned with the conductive interconnect feature 157a that acts as a source contact for the source region 105c of the lower device 140. For example, an imaginary vertical line passes through both the source contact 118a and the conductive interconnect feature 157a (and also passes through the source regions 105a, 105c). As illustrated, the imaginary vertical line is perpendicular to a length of the horizontal nanoribbons 103.

Similarly, as illustrated, the drain contact 118b of the upper device 101 is above and at least in part aligned with the conductive interconnect feature 157b that acts as the drain contact for the drain region 105d of the lower device 140. For example, another imaginary vertical line (e.g., perpendicular to a length of the horizontal nanoribbons 103) passes through both the drain contact 118a and the conductive interconnect feature 157b (and also passes through the drain regions 105b, 105d).

In an example, the conductive interconnect features 157a, 157b comprise conductive material, such as one or more appropriate metals, e.g., one or more of copper, ruthenium, molybdenum, tin, indium, antimony, aluminum, or bismuth, or an alloy thereof. In an example, each of the conductive interconnect features 157a, 157b may be a multiplayer feature, e.g., comprising one or more liner or barrier layers, and conductive fill material within the liner or barrier layers. In an example, the liner or barrier layers prevent or reduce diffusion of the conductive fill material to adjacent dielectric material.

As illustrated in FIG. 1A, in an example, the drain contact 118b of the upper device 101 lands on a conductive layer 149 that is within the isolation region 150b. In an example, the conductive layer 149 comprises an appropriate metal or an alloy thereof, e.g., one or more of copper, ruthenium, molybdenum, tin, indium, antimony, aluminum, or bismuth. In an example, the conductive layer 149 acts as a conductive interconnect feature, such as a conductive via extending through the isolation region 150b. The conductive layer 149 electrically couples the drain region 105b of the upper device 101 and the drain region 105d of the lower device 140, e.g., by electrically coupling the drain contact 118b of the upper device 101 with the drain region 105d of the lower device 140. Thus, the drain contact 118b is coupled to the drain region 105b of the upper device 101 (e.g., through one or more layers of silicide, germanides, and/or germanosilicide), and is also coupled to the drain region 105d of the lower device 140 (e.g., through the conductive layer 149). Hence, the drain contact 118b can act as a contact to both the drain region 105b of the upper device 101 and the drain region 105d of the lower device 140, and the drain regions 105b, 105d of the upper and lower devices 101, 140 are electrically shorted by the conductive layer 149.

FIG. 1A1 illustrates the integrated circuit structure 100 of FIG. 1A, but with a different profile of a conductive layer 149 between a drain region 105b of the upper device 101 and a drain region 105d of the lower device 140, in accordance with an embodiment of the present disclosure. For example, in FIG. 1A, the conductive layer 149 was at least in part embedded within the isolation region 150b. In contrast, in FIG. 1A1, the conductive layer 149 occupies a substantial (e.g., entire) portion of a space between the drain region 105b of the upper device 101 and the drain region 105d of the lower device 140. Thus, in the example of FIG. 1A1, little or no isolation region 150b is between the drain region 105b of the upper device 101 and the drain region 105d of the lower device 140.

In the example of FIG. 1A, the drain regions 105b, 105d are shorted, e.g., based on a design or application of the circuit that includes the structure 100. For example, some circuits may include CMOS architecture where the PMOS and NMOS drain regions are shorted, e.g., as illustrated in FIG. 1A (note that one of the upper or lower devices 101, 140 is a PMOS, and the other of the upper or lower devices 101, 140 is an NMOS). In the example where the drain contact 118b contacts both the drain regions 105b, 105d, the drain regions 105b, 105d may be accessed for signal transmission from the frontside (e.g., using the drain contact 118b), and the conductive interconnect feature 157b may (or may not) act as a dummy drain contact on the backside of the die (e.g., the conductive interconnect feature 157b may or may not be used for signal transmission to and/or from the drain regions 105b, 105d. In an example where the drain contact 118b contacts both the drain regions 105b and 105d, the conductive interconnect feature 157b may be absent (e.g., replaced by the substrate 144).

Note that in the example of FIG. 1A, while the drain regions 105b, 105d are electrically coupled by the conductive layer 149, the source regions 105a, 105c are isolated from each other by the isolation region 150a. However, based on the design and application of the circuit that includes the structure 100, in another example, the two source regions 105a, 105c may also be shorted by a conductive layer (e.g., similar to the conductive layer 149) within the isolation region 150a, e.g., instead of, or in addition to, the two drain regions 105b, 105d being shorted by the conductive layer 149.

In FIG. 1A, the source contact 118a is coupled to a conductive interconnect feature 120a (such as a conductive line or conductive via) above the source contact 118a. Although not illustrated, in an example, the conductive interconnect feature 120a electrically couples the source contact 118a to an interconnect structure that is on the frontside of the die. For example, the conductive interconnect feature 120a electrically couples the source contact 118a to one or more metallization levels of the interconnect structure on the frontside of the die. Thus, the source contact 118a couples the source region 105a of the upper device 101 to the interconnect structure on the frontside of the die, and the source contact 118a thus facilitates power and/or signal transmission to and/or from the source region 105a.

As illustrated (see FIG. 1), the source region 105c of the lower device 140 is coupled to the interconnect structure on the frontside of the die (also referred to herein as frontside interconnect structure) through the conductive interconnect feature 157a that is on the backside of the structure 100 (e.g., below the device layer 111). As illustrated in FIGS. 1A and 1, a part of the conductive interconnect feature 157a is below the source region 105c of the lower device 140, when viewed from the front of the structure, e.g., from the X-axis direction, see FIG. 1A. As illustrated in FIG. 1B, another part of the conductive interconnect feature 157a extends along the Y axis direction. For example, as illustrated in FIG. 1B, a first end (or a portion near the first end) of the conductive interconnect feature 157a is coupled to a bottom surface of the source region 105c of the lower device 140. An opposite second end (or a portion near the second end) of the conductive interconnect feature 157a is coupled to a conductive interconnect feature 119 (see FIGS. 1C and 1B). As illustrated in FIGS. 1A and 1B, the conductive interconnect feature 157a extends laterally within a horizontal plane, e.g., substantially parallel (e.g., with an angel range of 0 degrees to 10 degrees) to a plane of individual nanoribbons 103, from under the source region 105c of the lower device 140 to under the conductive interconnect feature 119. In an example, a thickness of the conductive interconnect feature 157a under the source region 105c is w2 and a thickness of the conductive interconnect feature 157a under the conductive interconnect feature 119 is w3, where w2 and w3 are substantially the same (e.g., within 3 nm, or 2 nm, or 1 nm or each other). Thus, the conductive interconnect feature 157a has a substantially same thickness along a length of the conductive interconnect feature 157a. In an example, the conductive interconnect feature 157a acts as a source contact to the source region 105c, and also performs local signal routing between the source region 105c and the conductive interconnect feature 119.

Note that in another example, thickness w3 may be smaller than thickness w2. For example, when forming the conductive interconnect feature 119, associated etch process may make a portion of the conductive interconnect feature 157a (on which the conductive interconnect feature 119 lands) to be at least partially etched. For example, FIG. 1B1 illustrates the integrated circuit structure 100 of FIG. 1B, but with a different profile of a conductive interconnect feature 157a, in accordance with an embodiment of the present disclosure. For example, in FIG. 1B1, the thickness w3 is less than w2, due to etching of the portion of the conductive interconnect feature 157a that is under the conductive interconnect feature 119. For example, a difference between w2 and w3 maybe in the range of 0 to 40 nm, or in a subrange of 1-40 nm, or 0-20 nm, or 1-20 nm, or 5-40 nm, or another appropriate subrange therewithin.

The conductive interconnect feature 119 is a substantially vertical conductive feature that at least in part extends through the device layer 111, see FIG. 1B. For example, the conductive interconnect feature 119 is a conductive vertical line or via that extends throughout a height of the stacked devices 101, 140. The conductive interconnect feature 119 is substantially perpendicular (e.g., with an angel range of 80 degrees to 100 degrees) to the substantially horizontal conductive interconnect feature 157a. In an example, the conductive interconnect feature 119 comprises conductive material, such as one or more appropriate metals, e.g., one or more of copper, ruthenium, molybdenum, tin, indium, antimony, aluminum, or bismuth, or an alloy thereof. In an example, the conductive interconnect feature 119 may be a multiplayer feature, e.g., comprising one or more liner or barrier layers, and conductive fill material within the liner or barrier layers. In an example, the liner or barrier layers prevent or reduce diffusion of the conductive fill material to adjacent dielectric material.

As illustrated in FIG. 1B, a bottom surface of the conductive interconnect feature 119 is substantially aligned with (e.g., within 5 nm or 10 nm of each other) or below a bottom surface of the source region 105c of the lower device 140. Similarly, a top surface of the conductive interconnect feature 119 is above a top surface of the source region 105a, and substantially aligned with (e.g., within 5 nm or 10 nm of each other) or above a top surface of the source contact 118a of the upper device 101.

In an example, when forming the conductive interconnect feature 119, a trench (e.g., through an inter-layer dielectric or ILD 137 encapsulating the stacked devices 101, 140) for the conductive interconnect feature 119 may be opened from the frontside, and accordingly, the conductive interconnect feature 119 may be tapered towards the bottom (e.g., an upper portion of the conductive interconnect feature 119 having a wider diameter than a lower portion of the conductive interconnect feature 119).

Also illustrated in FIG. 1B is another conductive interconnect feature 120c coupled to a top surface of the conductive interconnect feature 119. In an example, the conductive interconnect feature 120c electrically couples the source region 105c of the lower device 140, e.g., through the conductive interconnect features 157a and 119, to an interconnect structure that is on the frontside of the die. Thus, the conductive interconnect feature 119 facilitates transmission of power and/or signals between the source region 105c of the lower device and the interconnect structure on the frontside of the die.

Accordingly, the conductive interconnect feature 120a and the source contact 118a couple the source region 105a to the interconnect structure that is on the frontside of the die. Similarly, the conductive interconnect features 157a, 119, and 120c couple the source region 105c to the interconnect structure that is on the frontside of the die. Thus, in an example, both the source regions 105a and 105c can now be accessed from the frontside of the die.

As illustrated in FIG. 1B, the conductive interconnect feature 119 has an average width of w1, where the width w1 is measured at about a mid-point along a vertical height of the conductive interconnect feature 119. Note that because of the above discussed possible tapering of the conductive interconnect feature 119, the width may not be the same along a height of the conductive interconnect feature 119. As also illustrated in FIG. 1B, the conductive interconnect feature 119 has a height of h1. In an example, width w1 is within a range of 3-35 nm, or in the subrange of 3-30 nm, 3-20 nm, 3-10 nm, 5-35 nm, 5-20 nm, 5-10 nm, 10-35 nm, 10-20 nm, 20-35 nm, or another appropriate subrange thereof. In an example, vertical h1 is within a range of 40-300 nm, or in the subrange of 40-250 nm, 40-200 nm, 40-100 nm, 80-300 nm, 80-150 nm, 100-300 nm, 100-200 nm, or another appropriate subrange thereof.

Referring again to FIG. 1A, in one embodiment, each of gate structures 122 of the upper device 101 wraps around each of the nanoribbons 103a in the corresponding channel region. Gate spacers 132 isolates the gate structures 122 from contacting the source region 105a and the drain region 105b. In other embodiments, there may be other insulator layers (e.g., interlayer dielectric) that prevent such contact, whether in addition to the gate spacers 132, or in place of the gate spacers 132. In an example, conductive gate contacts 125a, 125b, and 125c provide contacts to respective three gate structures 122 of the device 101. In one embodiment, each of gate structures 172 of the lower device 140 wraps around each of the nanoribbons 103b in the corresponding channel region. Gate spacers 132 isolates the gate structures 172 from contacting the source region 105c and the drain region 105d. In other embodiments, there may be other insulator layers (e.g., interlayer dielectric) that prevent such contact, whether in addition to the gate spacers 132, or in place of the gate spacers 132.

Each of gate structures 122, 172 can be formed via gate-first or gate-last processing, and may include any number of suitable gate materials and configurations. In an embodiment, each of the gate structures 122, 172 includes a corresponding gate electrode and a gate dielectric 120 (not illustrated in FIG. 1C) between the gate electrode and the corresponding nanoribbons 103. For example, each of the gate structures 122 of the upper device 101 comprises a corresponding gate electrode 127 and corresponding dielectric material 120. Each of the gate structures 172 of the lower device 140 comprises a corresponding gate electrode 177 and corresponding dielectric material 120. In one example the gate spacers 132 may be considered part of the gate structure, whereas in another example the gate spacers 132 may be considered external to the gate structure.

In the example of FIG. 1A, a lower gate electrode 177 and a corresponding upper gate electrode 127 are in direct contact with each other. For example, there is no isolation structure between the upper and lower gate electrodes, and both gate electrodes are accessed from the top or frontside of the die (e.g., through one or more of the gate contacts 125a, 125b, 125c). However, in other examples, there may be a non-conductive isolation structure between vertically stacked upper and lower gate electrodes, and in some such examples, the upper gate stack is accessed from the top or frontside, and where the lower gate stack is accessed from the bottom or backside. In yet other examples, there may be a non-conductive isolation structure between vertically stacked upper and lower gate electrodes, and in some such examples, the upper gate stack is accessed from the top or frontside, and the lower gate stack is also accessed independently (e.g., independent of the upper gate stack access) from the top or frontside (e.g., using a conductive interconnect feature that may be at least in part similar to the conductive interconnect feature 119 discussed herein).

In an example, the gate electrode 127 of the device 101 and the gate electrode 177 of the device 140 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example.

In one embodiment, one or more work function materials (not illustrated in FIG. 1C) may be included around the nanoribbons 103. Note that work function materials are called out separately, but may be considered to be part of the gate electrodes. In this manner, a gate electrode may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons 103. In still other embodiments, there may be insufficient room for any gate fill material, after deposition of work function material (e.g., a given gate electrode may be all work function material and no fill material). Numerous gate structure configurations can be used along with the techniques provided herein, and the present disclosure is not intended to be limited to any particular such configurations.

The gate dielectric material 120 (shown with thick bolded lines in FIGS. 1A and 1B) warps around middle section of individual nanoribbons 103 (note that end sections of individual nanoribbons 103 are wrapped around by the gate spacers 132). The gate dielectric material 120 is between individual nanoribbons 103 and corresponding gate electrode, as illustrated. In an example, due to conformal deposition of the gate dielectric material 120, the gate dielectric material 120 may also be on inner sidewalls of the gate spacers 132, as illustrated.

The gate dielectric 120 may include a single material layer or multiple stacked material layers. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 120 is lanthanum. In some embodiments, the gate dielectric can be annealed to improve its quality when high-k dielectric material is used. In some embodiments, the gate dielectric 120 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer.

The semiconductor bodies 103a, 103b, which in this case are nanoribbons, can be any number of semiconductor materials as well, such as group IV material (e.g., silicon, germanium, or SiGe) or group III-V materials (e.g., indium gallium arsenide). In other embodiments, the semiconductor bodies 103 may be fins on which the corresponding gate structures are formed to provide double-gate or tri-gate configurations (as opposed to gate-all-around configurations with nanoribbons or wires). The semiconductor bodies 103 may be lightly doped, or undoped, and may be shaped or sculpted during the gate formation process, according to some embodiments. In some cases, semiconductor bodies 103 may be a multilayer structure, such as a SiGe body cladded with germanium, or a silicon body cladded with SiGe. Any number of channel configurations can be used.

In an example, the structure 100 is formed on a substrate 144. Embedded within the substrate 144 are the first conductive interconnect feature 157a below the source region 105c of the lower device 140, and the second conductive interconnect feature 157b below the drain region 105d of the lower device 140. As discussed, where the source region 105c of the lower device 140 is to be coupled to outside circuits from the backside of the die, the conductive interconnect feature 157a may be used for interconnections of the source region of the lower device 140.

Figure 1D:
FIG. 1D illustrates a cross-sectional view an integrated circuit structure including an upper device vertically stacked on a lower device, wherein the upper device comprises an upper source region and an upper drain region, wherein the lower device comprises a lower source region and a lower drain region, wherein the lower source region is accessed from a front side of the structure using a conductive interconnect feature that traverses along a height of the upper and lower devices, and wherein a top surface of the conductive interconnect feature is coupled to a first metallization level on the front side of the vertically stacked devices, in accordance with an embodiment of the present disclosure.

FIG. 1D illustrates a cross-sectional view an integrated circuit structure 100d (also referred to herein as "structure 100d") including an upper device 101 vertically stacked on a lower device 140, wherein the upper device 101 comprises an upper source region 105a and an upper drain region 105b, wherein the lower device 140 comprises a lower source region 105c and a lower drain region 105d, wherein the lower source region 105c is accessed from a front side of the structure 100 using a conductive interconnect feature 119 that traverses along a height of the upper and lower devices 101, 140, and wherein a top surface of the conductive interconnect feature 119 is coupled to a first metallization level (e.g., a lowest metallization level MO) on the front side of the vertically stacked devices, in accordance with an embodiment of the present disclosure. Note that the drain regions and the drain contacts of the upper and lower devices are not visible in the cross-sectional view of FIG. 1D.

Different components of the structure 100d of FIG. 1D are at least in part similar to corresponding components of the structure 100 of FIGS. 1A and 1, and similar components are illustrated using the same labels in the two figures. Comparing FIG. 1B with 1D, in the structure 100 of FIG. 1B, the conductive interconnect feature 119 extends vertically upward up to a level of the conductive interconnect feature 120a, and is coupled to the conductive interconnect feature 120c that is substantially at the same horizontal plane as the conductive interconnect feature 120a. For example, in FIG. 1B, a top surface of the conductive interconnect feature 119 is substantially coplanar with a top surface of the source contact 118a (e.g., the top surface of the conductive 119 feature is within a horizontal plane that is at most at a vertical distance of 5 nm, or 3 nm, or 1 nm from another horizontal plane of the top surface of the source contact 118a).

In contrast, in the structure 100d of FIG. 1D, the conductive interconnect feature 119 extends vertically upward up to a level that is above a level of the conductive interconnect feature 120a (e.g., a top surface of the conductive interconnect feature 119 is now above the top surface of the source contact 118a). For example, in FIG. 1D, the top surface of the conductive interconnect feature 119 is within a horizontal plane that is at least at a vertical distance of 3 nm, 5 nm, or 7 nm from another horizontal plane of a top surface of the source contact 118a. For example, the conductive interconnect feature 119 extends vertically upward up to a lowest metallization level (e.g., level MO) comprising conductive interconnect features 129. Thus, the top surface of the conductive interconnect feature 119 is coupled to a conductive interconnect feature 129 of the lowest metallization level. The conductive interconnect feature 120a (which is coupled to the source contact 118a) is also coupled to another conductive interconnect feature 129 of the lowest metallization level, e.g., through a conductive interconnect feature (e.g., a conductive via) 131. In an example, the top surface of the conductive interconnect feature 119 is substantially coplanar with a top surface of the conductive interconnect feature 131 (e.g., has an offset that is less than 1 nm). As illustrated, a vertical height h2 of the conductive interconnect feature 119 in the structure 100d of FIG. 1D is more than the vertical height h1 of the conductive interconnect feature 119 in the structure 100 of FIG. 1B.

Figure 1E:
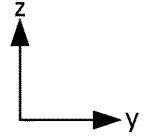
FIG. 1E illustrates a cross-sectional view an integrated circuit structure including an upper device vertically stacked on a lower device, wherein the upper device comprises an upper source region and an upper drain region, wherein the lower device comprises a lower source region and a lower drain region, wherein the lower source region is accessed from a front side of the structure using (i) a first conductive interconnect feature coupled to the lower source region, (ii) a second conductive interconnect feature that traverses along a height of the upper and lower devices, and (iii) a backside interconnect structure between the first conductive interconnect feature and the second conductive interconnect feature, in accordance with an embodiment of the present disclosure.

FIG. 1E illustrates a cross-sectional view an integrated circuit structure 100e (also referred to herein as "structure 100d") including an upper device 101 vertically stacked on a lower device 140, wherein the upper device 101 comprises an upper source region 105a and an upper drain region 105b, wherein the lower device 140 comprises a lower source region 105c and a lower drain region 105d, wherein the lower source region 105c is accessed from a front side of the structure 100 using (i) a first conductive interconnect feature 157a coupled to the lower source region 105c, (ii) a second conductive interconnect feature 119 that traverses along a height of the upper and lower devices 101, 140, and (iii) a backside interconnect structure 170 between the first conductive interconnect feature 157a and the second conductive interconnect feature 119, in accordance with an embodiment of the present disclosure.

Different components of the structure 100e of FIG. 1E are at least in part similar to corresponding components of the structure 100 of FIGS. 1A and 1, and similar components are illustrated using the same labels in the two figures. Comparing FIG. 1B with 1E, in the structure 100 of FIG. 1B, the conductive interconnect feature 119 is coupled to (e.g., in contact with) the conductive interconnect feature 157a. In contrast, in the structure 100e of FIG. 1E, the conductive interconnect feature 119 is coupled to the conductive interconnect feature 157a through the backside interconnect structure 170. The backside interconnect structure 170 comprises a plurality of conductive interconnect features 171, such as conductive lines (which may extend laterally in an example) and conductive vias (which may extend vertically in an example), as illustrated. The backside interconnect structure 170 at least in part extends laterally from under the conductive interconnect feature 157a to under the conductive interconnect feature 119. Thus, in this example, the conductive structure 157a acts as a source contact to the lower source region 105c and also acts as a local routing layer, to route between the lower source region 105c and the interconnect structure 170.

Figure 3A:
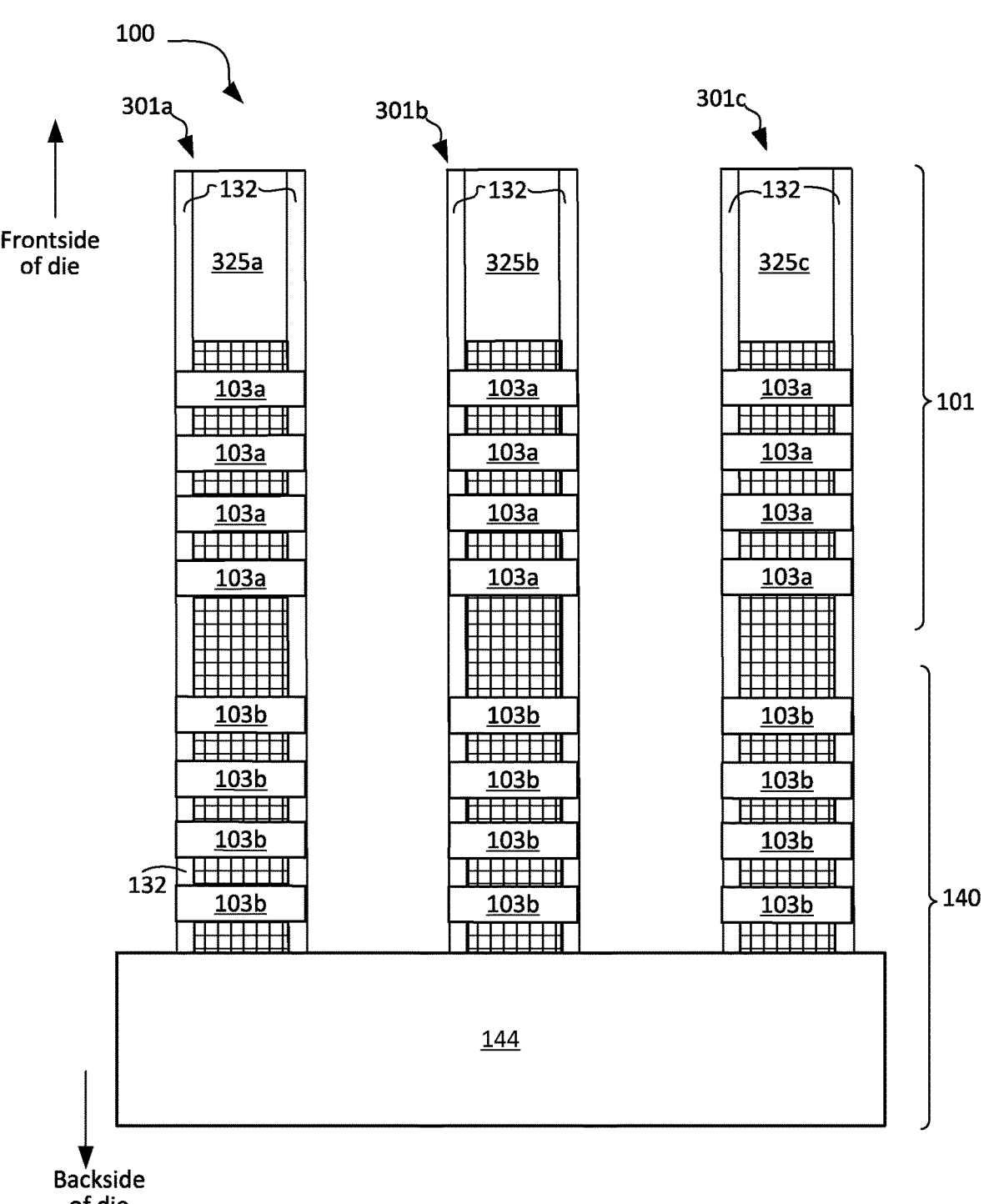

FIG. 2 illustrates a flowchart depicting a method 200 of forming the example semiconductor structure 100 of FIGS. 1A and 1B, in accordance with an embodiment of the present disclosure. FIGS. 3A, 3B, 3C1, 3C1, 3D, 3E1, 3E2, 3F1, 3F2, 3G1, and 3G2 collectively illustrate cross-sectional views of an example semiconductor structure (e.g., the semiconductor structure 100 of FIGS. 1A and 1B) in various stages of processing, in accordance with an embodiment of the present disclosure. FIGS. 2 and 3A-3G2 will be discussed in unison. The cross-sectional views of FIGS. 3A, 3B, 3C1, 3E1, 3F1, and 3G1 correspond to the cross-sectional view of FIG. 1A. The cross-sectional views of FIGS. 3C2, 3D, 3E2, 3F2, and 3G2 correspond to the cross-sectional view of FIG. 1B.

Referring to FIG. 2, the method 200 includes, at 204, for each of the vertically stacked device 101 and 140, forming one or more fins 301 (e.g., fins 301a, 301b, 301c, see FIG. 3A) comprising alternating layers of sacrificial material 309 and channel material 103, and forming dummy gate (e.g., which includes dummy gate electrode 325a, 325b, 325c), e.g., as illustrated in FIG. 3A. The process 204 may include any appropriate techniques for forming the fins and dummy gate stack of a GAA device architecture having two vertically stacked GAA device, such as devices 101 and 140.

Figure 3B:
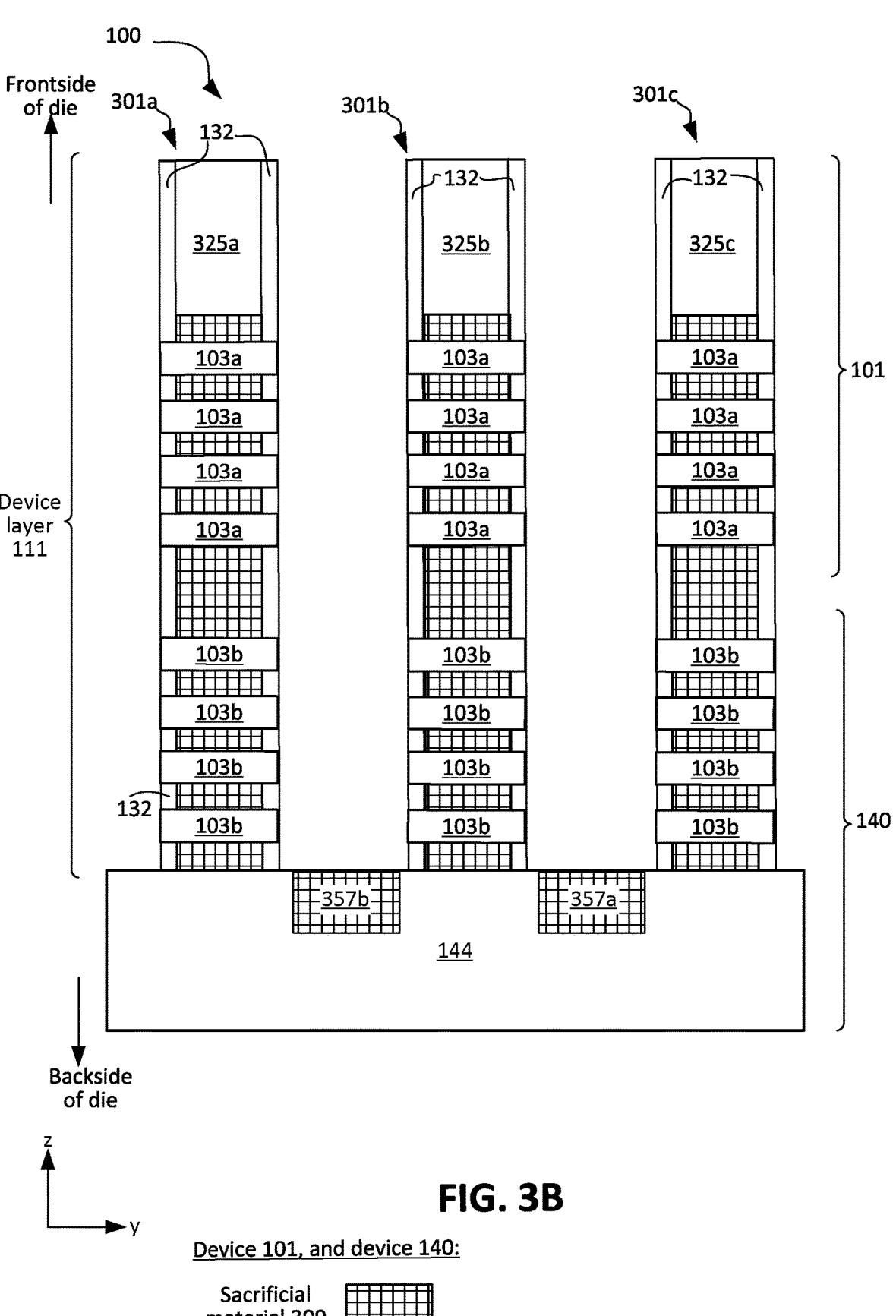

Referring again to FIG. 2, the method 200 then proceeds from 204 to 208, where from the frontside, recesses 357a, 357b within a base or substrate 144 are formed and filled with sacrificial material, as illustrated in FIG. 3B. In an example, the recesses 357a, 357b are for eventually forming the conductive interconnect features 157a, 157b. In an example, the recesses 357a, 357b are formed through the openings between the fins 301 (e.g., where the openings between the fins 301 would eventually be occupied by the source and drain regions of the two devices). As illustrated in FIG. 3B, the bottom surface of the recesses 357 are covered or encapsulated by the substrate 144.

Referring again to FIG. 2, the method 200 then proceeds from 208 to 212, where from the frontside, the source region 105c and drain region 105d of the lower device 140 is formed, source region 105a and drain region 105b of the upper device 101 is formed. In some examples, the lower portions of spacer 132 which are between neighboring nanoribbons are formed from within the source and drain trenches, prior to the epitaxial growth of the source and drain regions. For instance, in one such case, after source drain trenches are formed, a selective isotropic etch is used to laterally recess the sacrificial material 309, and then spacer material is deposited in those recesses. Excess spacer material can be removed with a selective etch. Then the source and drain regions can be formed via epitaxial growth. Dielectric fill material is then deposited and planarized (e.g., using CMP). After such source and drain region processing, the gate region processing can be carried out. In more detail, the dummy gate stack is removed to expose the channel region. This may be done, for instance, by masking off the source drain regions, and/or using a selective etch that only (or mostly) removes dummy gate materials. With the gate trench now formed, gate processing may continue with selectively removing the sacrificial material 309 from exposed channel region so as to release nanoribbons 103. Then, the final gate stacks for the upper and lower devices are formed. Then, source contact 118a and drain contact 118b are formed for the upper device 101, e.g., as illustrated in FIGS. 3C1 and 3C2. The two devices are encapsulated by an ILD 137. The process 20 may include any appropriate techniques for forming these components of a GAA device architecture having two vertically stacked GAA device, such as devices 101 and 140.

Thus, subsequent to the process 208, formation processes of the vertically stacked devices 101 and 140 are complete. Subsequent processes of the method 200 are for forming various conductive interconnect features of the structure 100.

As discussed herein previously, one of the devices 101 or 140 is a PMOS device, and the other of the devices 101 or 140 is an NMOS device. The doping profile and/or the material of the source and drain regions and/or the nanoribbons of a specific device may be in accordance with the type of the device. In an example, the device 101 is an NMOS device and the device 140 is a PMOS device, and the doping profile and/or the material of the source and drain regions and/or the nanoribbons of the devices 101 and 140 are selected accordingly. For example, source and drain regions of the device 140 can be PMOS source and drain regions that include, for example, group IV semiconductor materials such as silicon, germanium, SiGe, germanium tin (GeSn), SiGe alloyed with carbon (SiGe:C). Example p-type dopants include boron, gallium, indium, and aluminum. Source and drain regions of the device 101 can be NMOS source and drain regions that include, for example, silicon or group III-V semiconductor materials such as two or more of indium, aluminum, arsenic, phosphorus, gallium, and antimony, with some example compounds including but not limited to indium aluminum arsenide, indium arsenide phosphide, indium gallium arsenide, indium gallium arsenide phosphide, gallium antimonide, gallium aluminum antimonide, indium gallium antimonide, or indium gallium phosphide antimonide. In one specific embodiment, PMOS source and drain regions are boron-doped silicon or SiGe, and NMOS source and drain regions are phosphorus-doped silicon. More generally, the source and drain regions can be any semiconductor material suitable for a given application.

Figure 3D:
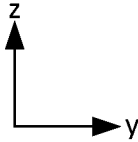

Referring again to FIG. 2, the method 200 then proceeds from 212 to 216, where from the frontside, a recess 319 with ILD 137 is formed, as illustrated in FIG. 3D. In an example, the recess 319 lands on the sacrificial material of the recess 357a. The recess 319 is for eventually forming the conductive interconnect feature 119.

Referring again to FIG. 2, the method 200 then proceeds from 216 to 220, where from the frontside, conductive material is deposited within the recess 319 to form the conductive interconnect feature 119. Also at 220, conductive interconnect features 120a, 120b, 120c are formed. FIGS. 3E1 and 3E2 illustrate each of the conductive interconnect features 119, 120a, 120b, 120c.

Referring again to FIG. 2, the method 200 then proceeds from 220 to 224, where the structure 100 is flipped upside-down, e.g., while being supported by a carrier wafer attached to its frontside, such that the backside of the structure is now above the frontside. Note that subsequent FIGS. 3F1, 3F2, 3G1, and 3G2 do not illustrate the flipped state of the structure, and continues to illustrate the backside of the structure to be below the frontside. Also at 224, the backside of the structure 100 is at least partly removed from the top (e.g., after the flipping of the structure), to reveal the sacrificial material of the recesses 357a, 357b, as illustrated in FIGS. 3F1 and 3F2. For example, the backside of the structure 100 is grinded and/or polished (e.g., using chemical and mechanical polishing (CMP), or mechanical polishing, or another planarization or polishing technique).

Referring again to FIG. 2, the method 200 then proceeds from 224 to 228, where from the backside, the sacrificial material of the recesses 357a, 357b is removed, and conductive material are deposited within the recesses 357a, 357b, to form the conductive interconnect features 157a, 157b, respectively, as illustrated in FIGS. 3G1 and 3G2. This completes formation of the conductive interconnect features 157a, 157b.

Referring again to FIG. 2B, the method 200 then proceeds from 228 to 232. At 232, a general integrated circuit (IC) is completed, as desired, in accordance with some embodiments. Such additional processing to complete an IC may include back-end or back-end-of-line (BEOL) processing to form one or more frontside and/or backside metallization layers and/or to interconnect the transistor devices formed, for example. Any other suitable processing may be performed, as will be apparent in light of this disclosure.

Note that the processes in method 200 are shown in a particular order for ease of description. However, one or more of the processes may be performed in a different order or may not be performed at all (and thus be optional), in accordance with some embodiments. Numerous variations on method 200 and the techniques described herein will be apparent in light of this disclosure.

The process 200 and FIGS. 3A-3G2 illustrate formation of the structure 100 of FIGS. 1A-1C. In an example, the process 200 can be appropriately modified to form the structure 100d of FIG. 1D or the structure 100e of FIG. 1E. For example, in the process 200, the recess 319 for the conductive interconnect feature 119 is formed prior to forming the conductive interconnect features 120a, 120b, and 120c, to form the structure 100 of FIGS. 1A-1B. In contrast, to form the conductive interconnect feature 119 in the structure 100d of FIG. 1D, the corresponding recess can be formed at an appropriate time before forming the lowest (e.g., MO) metallization level (e.g., after forming the conductive interconnect features 120a and 120b).

Also, to form the structure 100e of FIG. 1E, the conductive structure 157a is initially formed at the backside and from the backside of the die (e.g., see process 228 of method 200). Subsequently, the backside interconnect structure 170 is formed from the backside, where the backside interconnect structure 170 couples the conductive structure 157a to the conductive structure 119.

Example System

Figure 4:
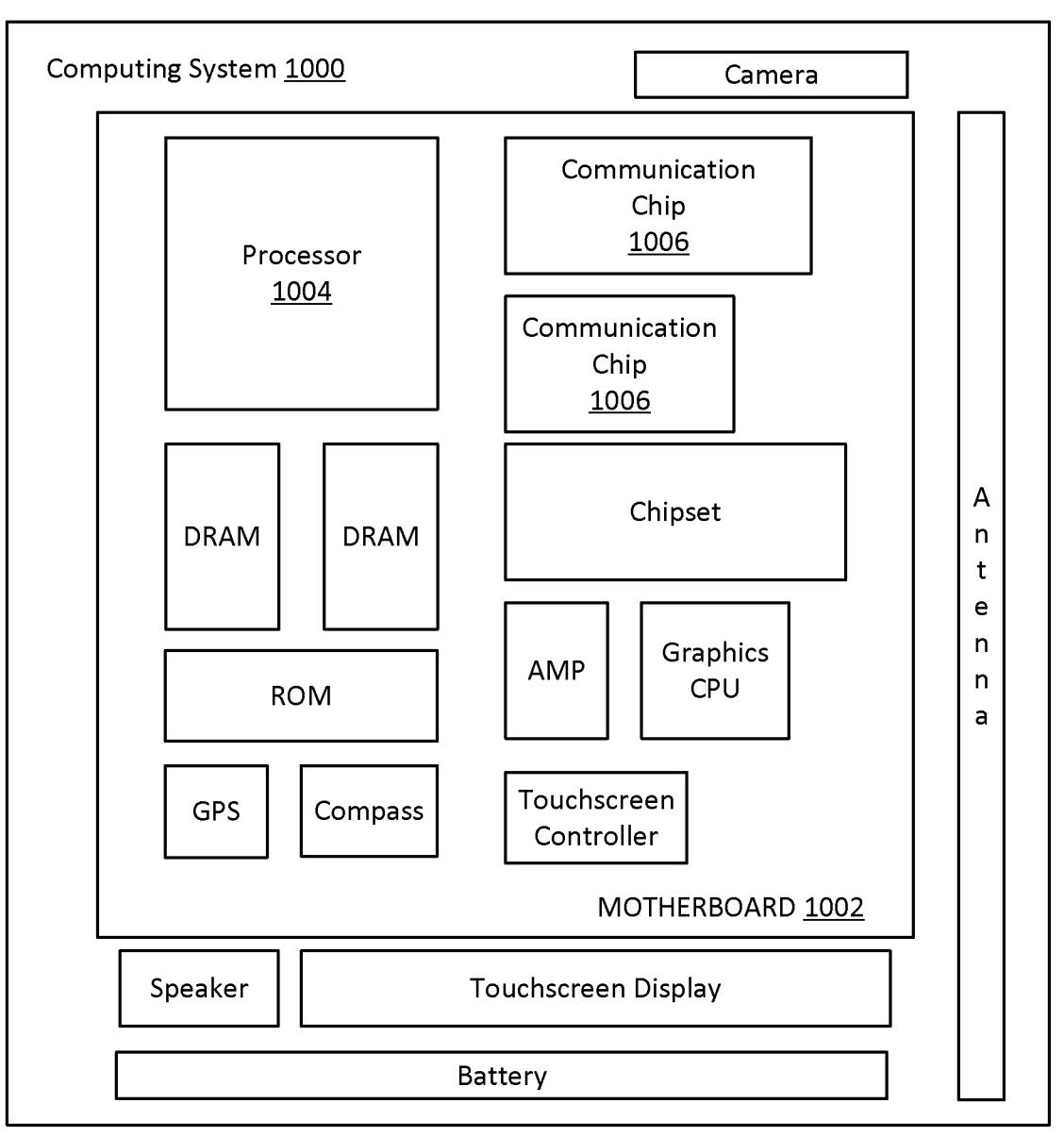
FIG. 4 illustrates a computing system implemented with integrated circuit structures formed using the techniques disclosed herein, in accordance with some embodiments of the present disclosure.

FIG. 4 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1. An integrated circuit structure, comprising: a device layer including an upper device stacked above a lower device, wherein the upper device comprises (i) an upper source or drain region and (ii) an upper source or drain contact coupled to the upper source or drain region, and wherein the lower device comprises a lower source or drain region; a first conductive feature below the device layer, the first conductive feature coupled to the lower source or drain region; and a second conductive feature vertically extending through the device layer, the second conductive feature to couple (i) the first conductive feature below the device layer and (ii) an interconnect structure above the device layer.

Example 2. The integrated circuit of example 1, wherein at least a part of the first conductive feature is below the lower source or drain region, and wherein the first conductive feature extends laterally away from the lower source or drain region, and the second conductive structure lands on the first conductive feature.

Example 3. The integrated circuit of any one of examples 1-2, wherein the second conductive feature is a via extending through the device layer.

Example 4. The integrated circuit of any one of examples 1-3, wherein the upper source or drain contact extends within the upper source or drain region.

Example 5. The integrated circuit of any one of examples 1-4, wherein the first conductive feature does not extend within the lower source or drain region.

Example 6. The integrated circuit of any one of examples 1-5, wherein the first conductive feature is a backside contact and the second conductive feature is a via extending through the device layer.

Example 7. The integrated circuit of any one of examples 1-6, wherein the first conductive feature extends laterally from under the second conductive feature to under the lower source or drain region, and wherein the first conductive feature has (i) a first thickness under the second conductive feature and (ii) a second thickness under the lower source or drain region, the first thickness being within 1 nm of the second thickness.

Example 7a. The integrated circuit of any one of examples 1-6, wherein the first conductive feature extends laterally from under the second conductive feature to under the lower source or drain region, and wherein the first conductive feature has (i) a first thickness under the second conductive feature and (ii) a second thickness under the lower source or drain region, the first thickness and the second thickness has a difference that is in the range of 1 to 40 nm.

Example 8. The integrated circuit of any one of examples 1-7a, wherein the first conductive feature includes multiple layers and/or the second conductive feature includes multiple layers.

Example 9. The integrated circuit of any one of examples 1-8, wherein the second conductive feature has a top surface that is coplanar with or above a top surface of the upper source or drain contact.

Example 10. The integrated circuit of any one of examples 1-8, wherein a top surface of the second conductive feature is within a horizontal plane that is at most at a vertical distance of 3 nm from another horizontal plane in which resides a top surface of the upper source or drain contact.

Example 11. The integrated circuit of any one of examples 1-8, wherein a top surface of the second conductive feature is within a horizontal plane that is at least at a vertical distance of 5 nm from another horizontal plane in which resides a top surface of the upper source or drain contact.

Example 12. The integrated circuit of any one of examples 1-8 or 10-11, wherein a top surface of the second conductive feature is in contact with a third conductive feature of a metallization layer above the device layer.

Example 13. The integrated circuit of any one of examples 1 or 3-12, further comprising: an additional interconnect structure comprising a plurality of interconnect features, the additional interconnect structure below the device layer, the additional interconnect structure to couple the first conductive feature with the second conductive feature.

Example 14. The integrated circuit of example 13, wherein the plurality of interconnect features of additional interconnect structure includes one or more conductive vias extending vertically and one or more conductive lines extending laterally.

Example 15. The integrated circuit of any one of examples 1-14, wherein the second conductive feature has a vertical height in the range of 40 to 300 nanometers.

Example 16. The integrated circuit of example 1, wherein: the upper source or drain region is a first upper source or drain region, the upper source or drain contact is a first upper source or drain contact, the lower source or drain region is a first lower source or drain region; the upper device further comprises (i) a second upper source or drain region and (ii) a second upper source or drain contact coupled to the second upper source or drain region; the lower device comprises a second lower source or drain region; and the second upper source or drain contact extends through the second upper source or drain region, and is electrically coupled to the second lower source or drain region through a conductive layer, the conductive layer within an isolation region between the second upper source or drain region and the second lower source or drain region.

Example 17. The integrated circuit of example 16, wherein: the upper device further comprises one or more upper bodies comprising semiconductor material, the one or more upper bodies extending between the first upper source or drain region and the second upper source or drain region; and the lower device further comprises one or more lower bodies comprising semiconductor material, the one or more lower bodies extending between the first lower source or drain region and the second lower source or drain region.

Example 18. The integrated circuit of example 17, wherein the one or more upper bodies comprise a vertical stack of nanoribbons, nanowires, or nanosheets.

Example 19. The integrated circuit of any one of examples 17-18, wherein the one or more lower bodies comprise a vertical stack of nanoribbons, nanowires, or nanosheets.

Example 20. The integrated circuit of example 17, wherein the one or more lower bodies is a fin and/or the one or more upper bodies is a fin.

Example 21. The integrated circuit of any one of examples 17-19, wherein each of the upper and lower devices is a gate-all-around (GAA) transistor.

Example 22. The integrated circuit of any one of examples 16-21, wherein the upper source or drain region is above the lower source or drain region, and the integrated circuit further comprises an isolation region comprising nonconductive material between the upper source or drain region and the lower source or drain region.

Example 23. An integrated circuit structure, comprising: a lower device; an upper device above the lower device, wherein the lower device comprises a lower source or drain region; a lower source or drain contact below, and coupled to, the lower source or drain region; and a conductive via to couple the lower source or drain contact to an interconnect structure above the upper device.

Example 24. The integrated circuit structure of example 23, wherein the conductive via lands on a surface of the lower source or drain contact and extends upward to contact the interconnect structure above the upper device.

Example 25. The integrated circuit structure of example 23, wherein the conductive via is coupled to the lower source or drain contact through an additional interconnect structure that is below the lower device, the additional interconnect structure including a plurality of conductive interconnect features.

Example 26. The integrated circuit of any one of examples 23-25, wherein the lower source or drain contact below the lower source or drain region is a backside contact, and the interconnect structure above the upper device is a frontside interconnect structure.

Example 27. The integrated circuit of any one of examples 23-26, wherein the upper device comprises an upper source or drain region, and wherein the integrated circuit further comprises: an upper source or drain contact at least in part above, and coupled to, the upper source or drain region, wherein the upper source or drain contact couples the upper source or drain region to the interconnect structure above the upper device.

Example 28. The integrated circuit of example 27, wherein: the upper source or drain contact extends within the upper source or drain region; and the lower source or drain contact does not extend within the lower source or drain region.

Example 29. The integrated circuit of any one of examples 27-28, wherein: the upper source or drain region is a first upper source or drain region, the upper source or drain contact is a first upper source or drain contact, the lower source or drain region is a first lower source or drain region; the upper device further comprises (i) a second upper source or drain region and (ii) a second upper source or drain contact coupled to the second upper source or drain region; the lower device comprises a second lower source or drain region; and the second upper source or drain contact extends through the second upper source or drain region, and is electrically coupled to the second lower source or drain region through a conductive layer, the conductive layer within an isolation region between the second upper source or drain region and the second lower source or drain region.

Example 30. An integrated circuit structure, comprising: a lower device; an upper device above the lower device, wherein the lower device comprises a lower source or drain region; an interconnect structure above the upper device; and a plurality of conductive features to couple the lower source or drain region to the interconnect structure above the upper device.

Example 31. The interconnect feature of example 30, wherein: the lower source or drain region is a first lower source or drain region; the lower device further comprises (i) a second lower source or drain region, and (ii) a body comprising semiconductor material laterally extending from the first lower source or drain region to the second lower source or drain region; the plurality of conductive features comprise (i) a first conductive feature laterally extending from a surface of the first lower source or drain region, and (ii) a second conductive feature that is on the first conductive feature and extends upward toward the interconnect structure above the upper device.

Example 32. The integrated circuit of example 31, wherein the body comprises a fin, a nanoribbon, a nanowire, or a nanosheet.

Example 33. The integrated circuit of any one of examples 30-32, wherein the second conductive feature extends upward to contact an interconnect feature of the interconnect structure above the upper device.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit, comprising:
  a device layer including an upper device stacked above a lower device, wherein the upper device comprises (i) an upper source or drain region and (ii) an upper source or drain contact coupled to the upper source or drain region, and wherein the lower device comprises a lower source or drain region;
  a first conductive feature below the device layer, the first conductive feature coupled to the lower source or drain region; and
  a second conductive feature vertically extending through the device layer, the second conductive feature to couple (i) the first conductive feature below the device layer and (ii) an interconnect structure above the device layer,
  wherein the first conductive feature extends laterally from under the second conductive feature to under the lower source or drain region, and wherein the first conductive feature has (i) a first thickness under the second conductive feature and (ii) a second thickness under the lower source or drain region, the first thickness being within 1 nm of the second thickness.

2. The integrated circuit of claim 1, wherein the first conductive feature is directly coupled to the lower source or drain region, and the second conductive feature lands on the first conductive feature.

3. The integrated circuit of claim 1, wherein the upper source or drain contact extends within the upper source or drain region.

4. The integrated circuit of claim 1, wherein the first conductive feature does not extend within the lower source or drain region.

5. The integrated circuit of claim 1, wherein the first conductive feature is a backside contact and the second conductive feature is a via extending through the device layer.

6. The integrated circuit of claim 1, wherein the second conductive feature has a top surface that is coplanar with or above a top surface of the upper source or drain contact.

7. The integrated circuit of claim 1, wherein a top surface of the second conductive feature is within a horizontal plane that is at most at a vertical distance of 3 nm from another horizontal plane in which resides a top surface of the upper source or drain contact.

8. The integrated circuit of claim 1, wherein a top surface of the second conductive feature is within a horizontal plane that is at least at a vertical distance of 5 nm from another horizontal plane in which resides a top surface of the upper source or drain contact.

9. The integrated circuit of claim 1, wherein a top surface of the second conductive feature is in contact with a third conductive feature of a metallization layer above the device layer.

10. The integrated circuit of claim 1, wherein the first conductive feature is directly coupled to the lower source or drain region, and the integrated circuit further comprises an additional interconnect structure comprising a plurality of interconnect features, the additional interconnect structure below the device layer, the additional interconnect structure to directly couple the first conductive feature with the second conductive feature.

11. The integrated circuit of claim 1, wherein:
  the upper source or drain region is a first upper source or drain region, the upper source or drain contact is a first upper source or drain contact, the lower source or drain region is a first lower source or drain region;
  the upper device further comprises (i) a second upper source or drain region and (ii) a second upper source or drain contact coupled to the second upper source or drain region;
  the lower device comprises a second lower source or drain region; and
  the second upper source or drain contact extends through the second upper source or drain region, and is electrically coupled to the second lower source or drain region through a conductive layer, the conductive layer within an isolation region between the second upper source or drain region and the second lower source or drain region.

12. The integrated circuit of claim 1, wherein the upper source or drain region is above the lower source or drain region, and the integrated circuit further comprises an isolation region comprising nonconductive material between the upper source or drain region and the lower source or drain region.

13. An integrated circuit structure, comprising:
  a lower device;
  an upper device above the lower device, wherein the lower device comprises a lower source or drain region;
  a lower source or drain contact below, and coupled to, the lower source or drain region; and
  a conductive via to couple the lower source or drain contact to an interconnect structure above the upper device,
  wherein the lower source or drain contact extends laterally from under the conductive via to under the lower source or drain region, and wherein the lower source or drain contact has (i) a first thickness under the conductive via and (ii) a second thickness under the lower source or drain region, wherein a difference between the first thickness and the second thickness is at least 1 nm.

14. The integrated circuit structure of claim 13, wherein the lower source or drain contact is directly coupled to the lower source or drain region, and wherein the conductive via lands on a surface of the lower source or drain contact and extends upward to contact the interconnect structure above the upper device.

15. The integrated circuit structure of claim 13, wherein the lower source or drain contact is directly coupled to the lower source or drain region, and wherein the conductive via is coupled to the lower source or drain contact through an additional interconnect structure that is below the lower device, the additional interconnect structure including one or more conductive interconnect features.

16. The integrated circuit structure of claim 13, wherein the upper device comprises an upper source or drain region, and wherein the integrated circuit further comprises:
  an upper source or drain contact at least in part above, and coupled to, the upper source or drain region, wherein the upper source or drain contact couples the upper source or drain region to the interconnect structure above the upper device.

17. An integrated circuit structure, comprising:
  a lower device;

an upper device above the lower device, wherein the lower device comprises a lower source or drain region;

an interconnect structure above the upper device; and a plurality of conductive features to couple the lower source or drain region to the interconnect structure above the upper device, wherein the plurality of conductive features comprises a first conductive feature coupled to a bottom surface of the lower source or drain region and a second conductive feature extending from the first conductive feature to the interconnect structure above the upper device, wherein the first conductive feature extends laterally from under the second conductive feature to under the lower source or drain region, and wherein the first conductive feature has (i) a first thickness under the second conductive feature and (ii) a second thickness under the lower source or drain region, the first thickness being within 1 nm of the second thickness.

18. The integrated circuit structure of claim 17, wherein:

the lower source or drain region is a first lower source or drain region; and the lower device further comprises (i) a second lower source or drain region, and (ii) a body comprising semiconductor material laterally extending from the first lower source or drain region to the second lower source or drain region.

19. The integrated circuit structure of claim 18, wherein the body comprises a fin, a nanoribbon, a nanowire, or a nanosheet.

20. The integrated circuit structure of claim 17, wherein the second conductive feature extends upward to contact an interconnect feature of the interconnect structure above the upper device.

21. The integrated circuit structure of claim 17, wherein the first conductive feature is directly coupled to the bottom surface of the lower source or drain region and to the second conductive feature.

22. The integrated circuit structure of claim 17, wherein the first conductive feature is directly coupled to the bottom surface of the lower source or drain region, and the integrated circuit further comprises one or more additional interconnect features below the lower device, the one or more additional interconnect features to directly couple the first conductive feature with the second conductive feature.

\* \* \* \* \*